United States Patent [19]
Ichinose et al.

[11] Patent Number: 5,863,412
[45] Date of Patent: Jan. 26, 1999

[54] ETCHING METHOD AND PROCESS FOR PRODUCING A SEMICONDUCTOR ELEMENT USING SAID ETCHING METHOD

[75] Inventors: Hirofumi Ichinose, Tsuzuki-gun; Ippei Sawayama, Machida; Akio Hasebe, Nagahama; Tsutomu Murakami, Nara; Masaya Hisamatsu, Kawasaki; Satoshi Shinkura, Tsuzuki-gun; Yukie Ueno, Nara, all of Japan

[73] Assignee: Canon Kabushiki Kaisha, Tokyo, Japan

[21] Appl. No.: 731,663

[22] Filed: Oct. 17, 1996

[30] Foreign Application Priority Data

Oct. 17, 1995 [JP] Japan ................................... 7-293313
Oct. 17, 1995 [JP] Japan ................................... 7-293314

[51] Int. Cl.$^6$ ................................... C25F 3/02; C25F 3/12
[52] U.S. Cl. ................................... 205/652; 205/656; 205/659; 205/674; 205/685
[58] Field of Search ................................... 205/656, 652, 205/659, 674, 685; 204/DIG. 9

[56] References Cited

U.S. PATENT DOCUMENTS

| | | | |
|---|---|---|---|
| 4,166,918 | 9/1979 | Nostrand et al. | 136/89 R |
| 4,419,530 | 12/1983 | Nath | 136/251 |
| 4,729,970 | 3/1988 | Nath et al. | 437/225 |
| 5,084,400 | 1/1992 | Nath et al. | 205/656 X |
| 5,320,723 | 6/1994 | Kawakami | 205/656 |
| 5,352,341 | 10/1994 | Joyner | 205/656 |

FOREIGN PATENT DOCUMENTS

| | | |
|---|---|---|
| 55-108779 | 8/1980 | Japan . |
| 62-290900 | 12/1987 | Japan . |

*Primary Examiner*—Donald R. Valentine
*Attorney, Agent, or Firm*—Fitzpatrick, Cella, Harper & Scinto

[57] ABSTRACT

A method for etching an object having a portion to be etched on the surface thereof, comprising a step of immersing said object in an electrolyte solution such that said object serves as a negative electrode; a step of arranging a counter electrode having a pattern corresponding to a desired etching pattern to be formed at said portion to be etched of said object in said electrolyte solution so as to maintain a predetermined interval between said counter electrode and said object, and a step of applying a direct current or a pulse current between said object and said counter electrode to etch said portion to be etched of said object into a pattern corresponding to said pattern of said counter electrode.

40 Claims, 9 Drawing Sheets

F I G. 6
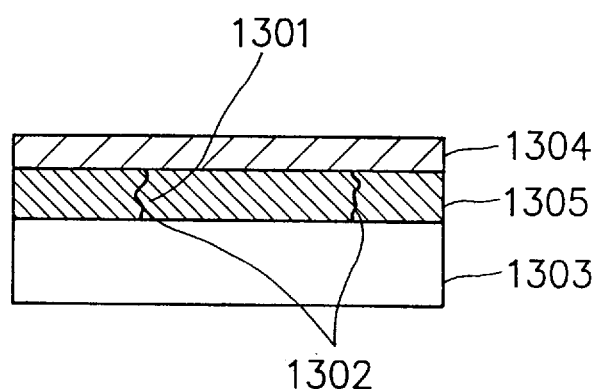
F I G. 7
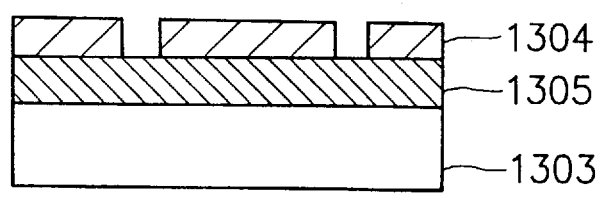

ETCHING METHOD AND PROCESS FOR PRODUCING A SEMICONDUCTOR ELEMENT USING SAID ETCHING METHOD

BACKGROUND OF THE INVENTION

1. Field of the Invention

The present invention relates to an improved etching method, a process for producing a semiconductor element using said etching method, and an etching apparatus suitable for practicing said etching method. More particularly, the present invention relates to an improved etching method which is simple and excels in selective etching precision and which enables to etching an object to be etched into a desirable state with no or very slight damage at the non-etched region or layer thereof. The present invention also relates to a process for producing a semiconductor element based on said etching method, which comprises a small number of steps and enables efficient production of semiconductor element by way of a fast etching, treatment, at a reduced production cost. By this method a transparent and electrically conductive film of a photovoltaic element as the semiconductor element can be patterned in a desirable state while repairing defects, such as short circuit defects of the photovoltaic element. The present invention further relates to an etching apparatus suitable for practicing the above method and process.

2. Related Background Art

In recent years, etching techniques have been widely used during the production of various semiconductor elements used in photovoltaic elements including solar cell elements, photodiodes, and the like. For instance, in the production of photodiodes and ICs (integrated circuits), the etching technique has been used in patterning or removing an electrode comprising a metal electrically conductive film or transparent and electrically conductive film, a base member or a semiconductor layer. Further, in the production of semiconductor elements such as solar cell elements, the etching technique has been used in patterning or removing an electrode comprising a transparent and electrically conductive film or a semiconductor layer. Besides these, patterning by way of etching a transparent and electrically conductive film has been used in the production of displays such as liquid crystal panels and the like.

Particularly, in the production of an amorphous silicon solar cell, there is known a manner of forming a transparent and electrically conductive film on a light transmissive insulating substrate, etching said transparent and electrically conductive film to have a desired pattern suitable for a solar cell, forming an amorphous silicon semiconductor layer as a photoelectric conversion layer on the patterned transparent and electrically conductive film, and forming a back side electrode thereon. Besides this, there is also known a manner of forming an amorphous silicon semiconductor layer as a photoelectric conversion layer on a metal substrate, forming a transparent and electrically conductive film on said semiconductor layer, etching said transparent and electrically conductive film into a desired pattern, and forming a grid electrode as a collecting electrode on the patterned transparent and electrically conductive film. The latter is advantageous in that the resultant solar cell with the metal substrate can be readily processed into a configuration having a bent portion, and electrochemical treatment for repairing a defective portion can be easily conducted because the substrate of the solar cell is comprised of a metal, and continuous film formation can be conducted.

A chemical etching method of selectively etching a transparent and electrically conductive film formed on a substrate to have a desired pattern in the production of a solar cell is known (see, Japanese Unexamined Patent Publication No. 108779/1980 and U.S. Pat. No. 4,419,530). Herein, such chemical etching method will be described.

In a first step, a photoresist (comprising a printing ink or resin) is formed on a transparent and electrically conductive film formed on a substrate by means of printing technique such as silk screen printing or flexographic printing or a spinner, and the photoresist is subjected to light exposure with a desired pattern, followed by subjecting to development, whereby forming a desired positive resist pattern. In a second step, a negative portion (excluding the positive resist pattern) comprising an exposed portion of the transparent and electrically conductive film is etched with an etching solution containing ferric chloride or nitric acid so that a portion of the transparent and electrically conductive film situated under the positive resist pattern remains. In this case, the negative portion may be removed by means of dry etching such as plasma etching so that the portion of the transparent and electrically conductive film situated under the positive resist pattern remains. In a third step, the positive resist pattern (comprising a cured photoresist pattern) remaining on the transparent and electrically conductive film is removed by eluting it with a releaser, peeling it, or manner of subjecting it to dry processing by plasma ashing, to thereby form a desired pattern of the transparent and electrically conductive film.

There is also known an electrochemical etching method of etching a transparent and electrically conductive film used in liquid crystal display or EL elements, wherein a transparent and electrically conductive film is formed on a substrate, a resist pattern is contacted with the surface of the transparent and electrically conductive film, the resultant is immersed in an electrolyte solution comprising an aqueous solution of HCl, followed by energization with an electric current, whereby an exposed portion of the transparent and electrically conductive film which is not covered by the resist pattern is patterned (see, Japanese Unexamined Patent Publication No. 290900/1987).

Incidentally, in the case of a thin film solar cell such as an amorphous silicon solar cell, there is sometimes a problem in that the output of the voltage and electric current is markedly decreased due to short circuit defects created during the formation of its semiconductor layer. Such short circuit defects are usually created in the case where defects such as pinholes of electrically connecting the upper and lower electrodes to the semiconductor layer are present. There is a tendency that such short circuit defects increase as the size of the solar cell is enlarged.

In view of this, in the case where a large area solar cell is continuously fabricated, for instance, by way of the so-called roll-to-roll process, after the formation of the semiconductor layer or transparent and electrically conductive film, it is necessary to eliminate the short circuit defects which are possibly present therein.

U.S. Pat. No. 4,166,918 discloses a method of removing short circuit defects created during the fabrication process of a solar cell. This method is to burn out the short circuit defects present in the solar cell by applying a reverse bias voltage of sufficient magnitude which is less than the breakdown voltage of the solar cell. Besides this, U.S. Pat. No. 4,729,970 discloses a method of passivating short circuit defects in a solar cell by applying a reverse bias voltage to the solar cell in an electrolyte solution to remove a transparent and electrically conductive film composed of ITO (Indium Tin Oxide.) or the like present at the peripheries of the short circuit defects whereby passivating the short circuit current current paths.

In general, in the case of fabricating a large sized solar cell, there is often employed a manner of patterning the transparent and conductive film to have a desired size by subjecting the transparent and conductive film to etching treatment, removing the short circuit defects, and forming a collecting electrode. In accordance with this method, it is possible to fabricate a large area thin film solar cell having a high performance.

Now, any of the conventional patterning processes by way of the etching treatment is problematic in that it involves a variety of steps, i.e., the formation of a positive resist pattern using a photoresist, exposure, development, etching, resist removal, and the like, and they have such problems as will be described below.

For the conventional chemical etching process, there are problems such that because the etching treatment is conducted in an electrolyte solution, the expansion or removal of a resist is liable to occur and therefore, it is difficult to attain precise etching. In addition, it is necessary to precisely control not only the temperature for the etching solution but also the period of time during which the etching treatment is conducted.

For the conventional dry etching process, although it is possible to attain the patterning at a high precision, there are problems such that the treatment speed is slow and the throughput of the apparatus used is low, resulting in increased production cost, and in addition, since a strong oxidant is used, specific handling steps are necessary for it and also the waste liquid.

For the conventional plasma ashing process, although it is free of environmental pollution because no solution is used, there is a problem in that it cannot be employed for all the resists.

For the conventional electrochemical etching process, although it is advantageous in that the temperature of the etching solution need not be as precisely controlled as in the case of the foregoing chemical etching process, there are drawbacks such that to obtain a desired etched pattern, a given resist pattern is necessary to be in close-contact with the surface of a transparent and electrically conductive film formed on a substrate, no patterning can be conducted without the presence of a photoresist, and the step of forming a pattern is essential.

In the case of patterning a transparent and electrically conductive film formed on a stacked body comprising a plurality of thin film layers being stacked as a semiconductor layer for a photovoltaic element or the like by means of the conventional chemical or electrochemical etching process, there are such problems as will be described in the following. That is, when the treatment period of time with the etching solution is long, negative influences are liable to effect to the stacked body; and when the control of the temperature of the etching solution is not sufficiently conducted, defectively etched portions are liable to occur, resulting in electrical shorts or shunts the resulting photovoltaic element. In the etching process using the resist, there are also problems. When resist separation occurs during the etching process, overetching often occurs to unnecessarily etch a portion, resulting in exterior defects for a photovoltaic element and/or in making the resulting photovoltaic element to have inferior characteristics; and in this case, there is a tendency of damaging a region or layer which is not to be etched.

In the patterning process by the etching treatment by way of in the fabrication of a solar cell, patterning is usually conducted through a photoresist or the like by means of the chemical etching process, dry etching process, or electrolytic etching. And in any case, a variety of steps, i.e., close-contact of a photoresist pattern to a solar cell substrate, etching, removal of the photoresist, rinsing, washing, drying, and the like are necessary. And after the completion of these steps, a further step of removing short circuit defects possibly present in the solar cell substrate is often conducted.

In accordance with the roll-to-roll process, it is possible to continuously form a semiconductor layer, a transparent, electrically conductive film and the like. However, in practice, it is difficult to make the etching process and the short circuit defects-removing process so that they can be continuously conducted. And the etching steps involve a variety of treatment steps as above described. Therefore, even in the case where the roll-to-roll process is employed, there are problems such that it is difficult to attain the fabrication of a defect-free solar cell at a high yield and with a reduced production cost. In addition to this, because the etching process and the short circuit defects-removing process are separately conducted, in the case of mass-producing a solar cell, there is an increased possibility in that physical defects will arise.

Therefore, there is an increased demand for making an improvement in the conventional process for fabricating a solar cell so that the etching process and the short circuit defects-removing process can be continuously conducted.

Incidentally, the patterning in accordance with conventional etching process using an etching apparatus is conducted, for example, in the manner shown in FIG. 1(a) through FIG. 1(h). Particularly, first, on a transparent and electrically conductive film 202 formed on a metal substrate 201 (see, FIG. 1(a)), a resist 204 is formed using a coating device 203 (see, FIG. 1(b)), followed by drying using a drier (not shown). Thereafter, a mask pattern 205 is arranged on the resist 204, followed by subjecting the resultant to light exposure using a light filter 206 (see, FIG. 1(c)). Successively, development is conducted in a vessel 207 containing a developer (see, FIG. 1(d)). After the development treatment, washing is conducted in a washing and rinsing vessel 208 (see, FIG. 1(e)), followed by drying. Thereafter, the body is subjected to etching treatment in an etching vessel 209 containing an etching solution (see, FIG. 1(f)), followed by removing the resist in a resist removing vessel 210, and successively followed by washing and then drying (see, FIG. 1(g)), where the transparent and electrically conductive film 202 on the metal substrate 201 is patterned as shown in FIG. 1(g). FIG. 1(h) is a schematic slant view illustrating a product having a desired pattern thus obtained.

In the above photolithography patterning process comprising the foregoing numerous steps, these steps are extremely difficult to combine, and the respective instruments in which the respective steps are conducted are also extremely difficult to integrate. If some of these steps could be designed so that they can be conducted in the same instrument, the instrument is unavoidably large. Hence, it is extremely difficult to realize such a system that these numerous steps can be continuously conducted to complete the patterning process within a short period of time.

This situation is more or less the same also in the fabrication of a solar cell. Particularly, the etching process in the fabrication of a solar cell involves numerous steps similar to those described in the above, and these numerous steps and the respective instruments in which the respective steps are conducted are extremely difficult to combine. Therefore, it is necessary to use separate instruments to conduct each step. In addition, it is extremely difficult to realize an apparatus which is capable of conducting both the etching process involving the numerous steps and the short circuit defects-removing process in the apparatus. If the etching process and the short circuit defects-removing process could be designed so that they can be conducted in one apparatus, the apparatus is unavoidably large. Hence, it is extremely difficult to realize such a system that the etching process and the short circuit defects-removing process can be continuously conducted within a short period of time.

SUMMARY OF THE INVENTION

A principal object of the present invention is to eliminate the foregoing problems in the prior art and to provide an etching process which has few, simple treatment steps0 and excels in selective etching precision, and which enables stably and efficiently conducting selective etching for an object to be treated by way of etching treatment such as a transparent and electrically conductive film or the like at an improved selective etching precision.

Another object of the present invention is to provide a highly reliable semiconductor element such as a photovoltaic element including a solar cell or the like which is free of short circuit defects including shunts, exterior defects and the like and which is free of a damage in the non-etched region or layer.

A further object of the present invention is to provide a process which enables continuously conducting a patterning process by way of etching treatment and a short circuit defects-removing process, wherein a highly reliable semiconductor element such as a photovoltaic element including a solar cell or the like can be efficiently produced at a high yield and with a reduced production cost.

A further object of the present invention is to provide a process which enables stably conducting a patterning process by way of etching treatment with an improved patterning precision, wherein a highly reliable semiconductor element such as a photovoltaic element including a solar cell or the like which is free of short circuit defects including shunts, exterior defects and the like and which has a high performance can be efficiently produced at a high yield and with a reduced production cost.

A further object of the present invention is to provide an etching apparatus which is small in size, simple and less expensive, which can shorten the treatment period, and which enables stably and efficiently conducting selective etching for an object to be treated by way of etching treatment, such as a transparent and electrically conductive film or the like, at high precision.

A further object of the present invention is to provide an etching apparatus which is small in size and simple, which enables to conduct both a patterning process by way of etching treatment and a short circuit defects-removing process within a short time period in the apparatus. The apparatus also enables efficiently producing a highly reliable semiconductor element such as a photovoltaic element including a solar cell or the like which is free of short circuit defects including shunts, exterior defects and the like and which has a high performance which can be efficiently produced at a high yield and with a reduced production cost.

A typical embodiment of the etching process according to the present invention is for etching a substrate having a portion to be etched, comprising a step of immersing said substrate in an electrolyte solution such that said substrate serves as a negative electrode, a step of arranging a counter electrode having a pattern corresponding to a desired pattern to be formed at said portion to be etched of said substrate in said electrolyte solution so as to maintain an interval between said counter electrode and said substrate, and a step of applying a direct current or a pulse current between said substrate and said counter electrode to etch said portion to be etched of said substrate into a pattern corresponding to said pattern of said counter electrode.

A typical embodiment of the process for producing a semiconductor element according to the present invention comprises a step of immersing a substrate for a semiconductor element and having a portion comprising a film to be etched in an electrolyte solution such that said substrate serves as a negative electrode, a step of arranging a counter electrode having a pattern corresponding to a desired pattern to be formed at said portion to be etched of said substrate in said electrolyte solution so as to maintain a predetermined interval between said counter electrode and said substrate, and a step of applying a direct current or a pulse current between said substrate and said counter electrode to etch said portion to be etched of said substrate into a pattern corresponding to said pattern of said counter electrode.

A typical embodiment of the etching apparatus according to the present invention comprises a substrate holding segment for holding a substrate with a portion to be etched, an electrolytic bath for maintaining an electrolyte solution therein, a locomotive mechanism for moving the substrate holding segment in order to immerse the substrate held on the substrate holding segment in the electrolyte solution maintained in the electrolytic bath, and a counter electrode holding segment for holding a counter electrode having a pattern corresponding to a desired etching pattern to be formed at the portion to be etched of the substrate such that said counter electrode is positioned to oppose the substrate held on the substrate holding segment.

In the present invention, no resist is formed on the side of a substrate having a portion to be etched. Particularly, the principal feature of the present invention lies in that a given substrate having a portion to be etched and a counter electrode shaped in a desired pattern are arranged in an electrolyte solution such that the counter electrode is positioned to oppose the portion to be etched of the substrate, preferably in a state that the former is in close proximity to the latter, and a direct current or a pulse current is applied between them to etch the portion to be etched of the substrate into a pattern corresponding to the pattern of the counter electrode. This makes it possible to efficiently produce a highly reliable semiconductor device such as a photovoltaic element including a solar cell or the like which is free of short circuit defects including shunts, exterior defects and the like and which has a high performance can be efficiently produced at a high yield and with a reduced production cost.

The above described etching apparatus enables practicing the process according to the present invention.

The portion to be etched in the present invention can include a film to be etched which is disposed on a substrate and a film to be etched which is disposed on a substrate through an intermediary such as a semiconductor layer, electrode, or the like.

The locomotive mechanism for moving the substrate holding segment in the foregoing etching apparatus according to the present invention serves to immerse the substrate to be treated in and to take out the treated substrate from the electrolyte solution. The locomotive mechanism may be designed to have a mechanism capable of moving up and down or rotating to immerse the substrate to be treated in and to take out the treated substrate from the electrolyte solution.

The foregoing etching apparatus according to the present invention may be modified such that the substrate holding segment is pluralized and the substrates held on the substrate holding segments can-be continuously immersed in and taken out from the electrolyte solution by virtue of the revolution of the locomotive mechanism.

Further, in the present invention, the substrate may be held on the substrate holding segment in a mechanical manner or by virtue of a magnetic force generated by a magnetic force generation means such as an electromagnet.

BRIEF DESCRIPTION OF THE DRAWINGS

FIG. 6 is a schematic cross-sectional view illustrating an example of a semiconductor element having short circuit defects.

FIG. 7 is a schematic cross-sectional view illustrating an example of a repaired semiconductor element in which short circuit defects are removed.

DESCRIPTION OF THE INVENTION AND PREFERRED EMBODIMENTS

Figure 1A:
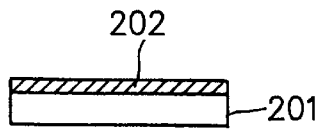
FIGS. 1(a) through 1(g) are schematic cross-sectional views for explaining a conventional etching process using photolithography.
Figure 1C:
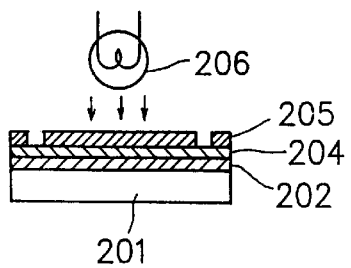
Figure 1E:
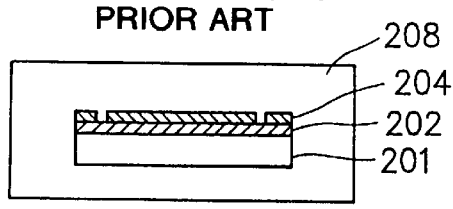
Figure 1G:
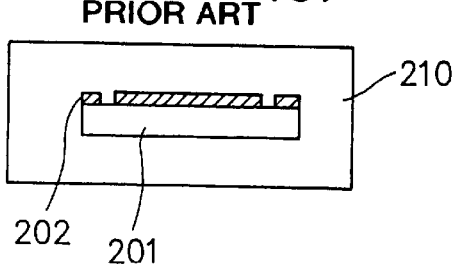
Figure 1B:
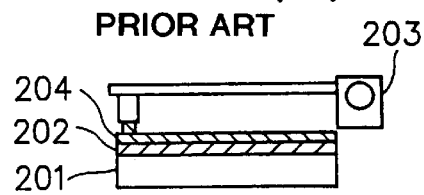
Figure 1D:
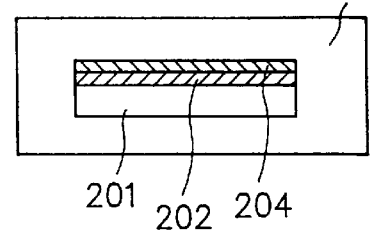
Figure 1F:
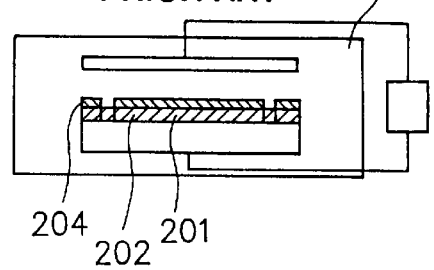
Figure 1H:
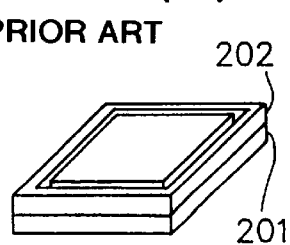
FIG. 1(h) is a schematic slant view illustrating a product having an etched pattern obtained in accordance with the etching process shown in FIGS. 1(a) through 1(g).

The present inventors conducted extensive studies through experiments in order to eliminate the foregoing problems found in the conventional method for etching a given portion to be etched of a film using reduction and dissolution phenomena based on electrochemical reaction and in order to find out an etching process which enables the efficient production of a desired, etched pattern at the portion to be etched of the film without those problems found in the prior art.

As a result, there was found an improved etching method which enables continuously etching an object to be etched in a desired pattern with improved etching precision while desirably eliminating defects such as short circuit defects in the same apparatus.

The present invention has been accomplished based on this finding.

The present invention lies in an improved etching process comprising the steps of: immersing a substrate having a portion comprising a film to be etched in an electrolyte solution such that the substrate serves as a negative electrode; arranging a counter electrode such that the counter electrode is positioned to oppose the substrate; and applying a direct current or a pulse current between the substrate and the counter electrode to selectively etch the portion to be etched of the substrate into a desired pattern by electrolytic reduction.

The present invention includes a process for producing a semiconductor element comprising the steps of: (a) providing a semiconductor element comprising a semiconductor layer and a transparent and a transparent and electrically conductive film formed in the named order on a substrate (comprising a metal body); (b) immersing the semiconductor element in an electrolyte solution such that the substrate side of the semiconductor element serves as a negative electrode; (c) arranging a counter electrode such that the counter electrode is positioned to oppose the semiconductor element; and (d) applying a direct current or a pulse current between the substrate of the semiconductor element and the counter electrode to selectively etch the transparent and electrically conductive film of the semiconductor element into a desired pattern by electrolytic reduction. If necessary, this process further comprises a step of applying a forward bias to the side of the substrate of the semiconductor element to subject the transparent and electrically conductive film present at the peripheries of defects, such as short circuit defects in the semiconductor element, to electrolytic reduction whereby eliminating said defects.

According to the present invention, the formation of a highly precise etched pattern comprising a transparent and electrically conductive film can be achieved.

Further, according to the present invention, desirable patterning at high precision and elimination of short circuit defects can be continuously conducted.

In the following, detailed description will be made of the present invention.

In general, as the transparent and electrically conductive film used in an amorphous solar cell or the like, a film excelling in transparency against visible light and also in electrical conductivity such as a $SnO_2$ film, $In_2O_3$ film, ITO ($In_2O_3+SnO_2$) film, or the like is used. These transparent and electrically conductive films may be formed by means of vacuum evaporation, ionization evaporation, sputtering, CVD (chemical. vapor deposition), or spray coating.

In the case where these transparent and electrically conductive films are used in the amorphous solar cell, it is necessary for them to be patterned for their predetermined, selected region by way of etching treatment. However, these transparent and electrically conductive films are insoluble in acids and bases and therefore, they are difficult to etch.

Particularly, the reaction When they are chemically etched is slow, and because of this, in order to increase the reaction speed upon chemical etching, it is necessary to conduct the reaction a high temperature.

On the other hand, in the case of the so-called electrochemical etching process, as various electrolyte solutions can be used, the reaction involved in the etching proceeds at room temperature, and it is not necessary to externally supply heat energy. In the electrochemical etching process, nascent hydrogen generated on the cathode side upon the electrolysis reduces a transparent and electrically conductive film to dissolve in the electrolyte solution, whereby a given portion of the transparent and electrically conductive film is removed.

In the present invention, the electrolyte used in the electrolyte solution is different depending upon the kind of the transparent and electrically conductive film involved. Specific examples of the electrolyte are sodium chloride, potassium chloride, aluminum chloride, zinc chloride, tin chloride, ferric chloride, sodium nitride, potassium nitride, hydrochloric acid, nitric acid, and sulfuric acid.

The counter electrode used in the present invention may be one or more materials selected from the group consisting of platinum, carbon, gold, stainless steel, nickel, copper and lead. Of these materials, gold, platinum, and carbon are the most appropriate because these are chemically stable and can be readily processed into a desired pattern.

Figure 2A:
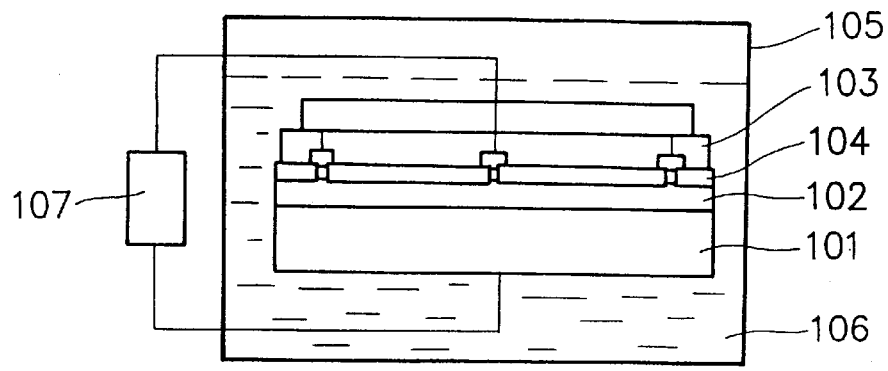
FIG. 2(a) is a schematic diagram for explaining an example of an etching process according to the present invention.
Figure 2B:
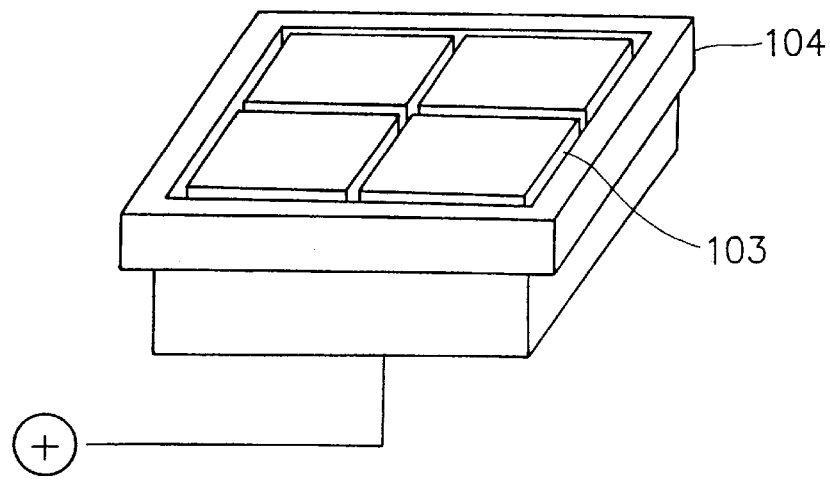
FIG. 2(b) is a schematic slant view for explaining an example of the pattern of a counter electrode used in the etching process shown in FIG. 2(a).

In the present invention, it is possible to install an appropriate gapping member between the substrate having a portion (for example, comprising a transparent and electrically conductive film) to be etched and the counter electrode, for instance, such that the counter electrode is pinched by the gapping member without being contacted with the gapping member, but the gapping member is contacted with the portion of the substrate to be etched. In this case, there can employed, for example, an etching process as shown in FIGS. 2(a) and 2(b). FIG. 2(a) is a schematic lateral view illustrating a situation where substrate and the counter electrode are arranged in close proximity to each other through the gapping member in the electrolyte solution. FIG. 2(b) is a schematic slant view illustrating the arrangement of the counter electrode and gapping member, viewed from the gapping member side.

Figure 2C:
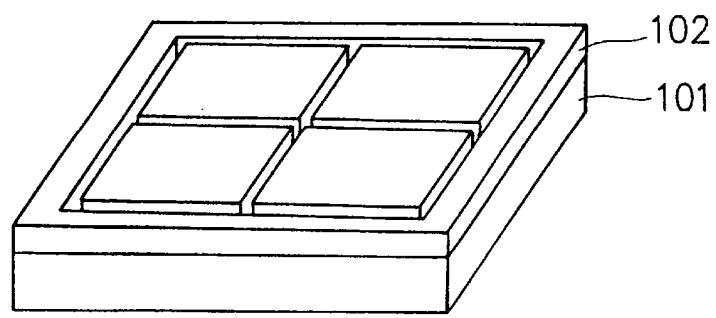
FIG. 2(c) is a schematic slant view illustrating an example of a patterned product obtained in accordance with the etching process shown in FIG. 2(a).

FIG. 2(c) is a schematic slant view illustrating an example of a patterned transparent and electrically conductive film.

In FIGS. 2(a) through 2(c), reference numeral 101 indicates a substrate, reference numeral 102 a film (for example, a transparent and electrically conductive film) to be etched, reference numeral 103 a counter electrode, reference numeral 104 a gapping member, reference numeral 105 an electrolytic bath, reference numeral 106 an electrolyte solution, and reference numeral 107 a power source.

According to the manner shown in FIGS. 2(a) and (b), a desired etched pattern can be obtained depending on the pattern of the counter electrode exposed to the electrolyte solution.

In FIGS. 2(a) and 2(b), four counter electrodes are arranged to establish a ⊞ shape, and the patterning by way of etching treatment is conducted.

Detailed description will be made of the manner shown in FIGS. 2(a) through 2(c). The substrate 101 having the film 102 to be etched is immersed in the electrolyte solution 106, and the substrate 101 side is electrically connected to a negative electrode of the power source 107. The counter electrode 103 is positioned while maintaining a predetermined interval to the substrate through the gapping member 104, where the counter electrode 103 is not contacted with the gapping member 104, but it is contacted with the film 102 of the substrate 101, and the electrolyte solution 106 is always present between the film 102 of the substrate 101 and the counter electrode 103. But the interface between the gapping member 104 and the film 102 of the substrate 101 is always maintained in a state free of the electrolyte solution 106. The counter electrode 103 is electrically connected to a positive electrode of the power source 107. By switching on the power source, a direct current or pulse current is applied between the counter electrode 103 and the substrate 101 to cause reduction reaction only at the surface of the film 102 situated to oppose the counter electrode 103, where the film 102 is etched into a pattern corresponding to the pattern of the counter electrode 103. Therefore, no mask is necessary to be formed on the film 102 side. And by properly adjusting the width and thickness of the gapping member 104, the depth of the film 102 to be etched can be adjusted as desired in relation to the density of the current flow. In general, the width and thickness of the gapping member 104 is desired to be adjusted in the range of from 0.1 mm to 2 mm. In the case where the interval between the counter electrode 103 and the substrate 101 is too large, it is difficult to form a desirable etched pattern corresponding to the pattern of the counter electrode 103.

Further, by properly adjusting the period of time during which the direct current is applied or/and the quantity of the direct current applied, or by applying the pulse current, the selectivity of the patterning by way of the etching treatment can be controlled as desired.

The gapping member 104 is desirably a soft material having resistance to chemicals such as silicone rubber, silicone sponge, or the like.

In order to conduct the etching treatment together with the patterning, it is necessary to facilitate the electrolytic reduction reaction by the application of a direct current or pulse current as above-described. The electrolytic reduction reaction may be controlled by properly adjusting the concentration of the electrolyte solution. However, the use of an electrolyte solution with a high concentration often entails a problem of corroding a metallic portion of the apparatus used.

By properly adjusting the period of time during which the electric current is applied or/and the quantity of the electric current applied, a desirable etched pattern can be formed even in the case of using an electrolyte solution with a reduced concentration.

The formation of a uniform linear pattern can be attained in the case where the electric current applied is made constant.

Further, in the case where the electric current applied is in a pulse shape, the film (for example, comprising a transparent and electrically conductive film) is step-wise etched in a thin film-like state in multiple-steps, and because of this, a highly precise sharp linear pattern with no residue of the reduced film portion thereon can be obtained.

Now, the patterning precision of the film to be etched, such as a transparent and electrically conductive film, has a significant effect on the characteristics of a semiconductor device (including a photosemiconductor device) such as a photovoltaic element (including a solar cell) or the like.

Figure 3A:
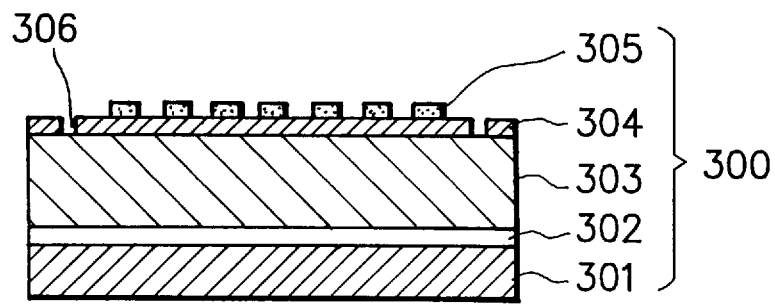
FIG. 3(a) is a schematic cross-sectional view illustrating an example of a semiconductor element produced according to the present invention.
Figure 3B:
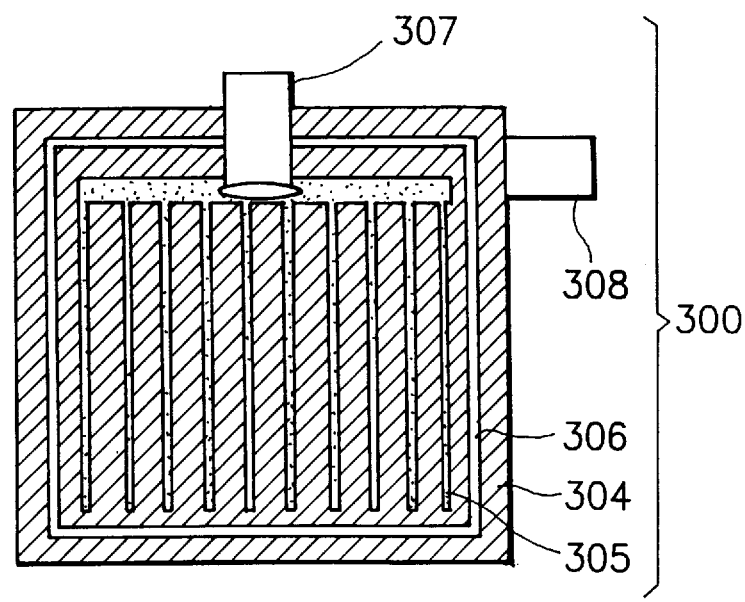
FIG. 3(b) is a schematic plan view of the semiconductor element shown in FIG. 3(a).

As an example of a semiconductor device prepared by conducting the patterning according to the present invention, there can be mentioned an amorphous solar cell as shown in FIGS. 3(a) and 3(b).

Herein, it should be understood that this is only illustrative, and the present invention is effective also in amorphous solar cells having a transparent substrate. It should be also understood that the present invention is effective in other semiconductor devices (particularly, photosemiconductor devices) having a semiconductor layer such as single-crystal series solar cells, polycrystal series solar cells, thin film polycrystal series solar cells, and microcrystal series solar cells.

FIG. 3(a) is a schematic cross-sectional view illustrating an amorphous solar cell. FIG. 3(b) is a schematic plan view of the amorphous solar cell, viewed from the light incident side. In the amorphous solar cell shown in FIGS. 3(a) and 3(b), its constituent layer on the substrate is patterned as required.

In FIGS. 3(a) and 3(b), reference numeral 300 indicates the entire of the amorphous solar cell, reference numeral 301 a substrate, reference numeral 302 a lower electrode layer, reference numeral 303 a semiconductor layer, reference numeral 304 a transparent and electrically conductive film with patterned portions 306, reference numeral 305 a collecting electrode (or a grid electrode), reference numeral 307 a positive side power outputting terminal, and 308 a negative side power outputting terminal.

The substrate 301 is usually an electrically conductive material in the case of the amorphous solar cell, and it serves also as a back side electrode (or a lower electrode). The lower electrode layer 302 serves as one of the two electrodes for outputting a electric power generated by the semiconductor layer 303.

The lower electrode layer 302 has a work function to provide an ohmic contact against the semiconductor layer 303. The surface of the lower electrode layer 302 contacted with the semiconductor layer 303 may be textured so as to cause irregular reflection of light. The lower electrode layer 303 may be a metal body, metal alloy or transparent and electrically conductive oxide. As such material, there can be mentioned, for example, Ag, Pt, AlSi, ZnO, $In_2O_3$, ITO, and the like.

The semiconductor layer 303 may comprise a single cell structure which comprises a single cell unit with a pn or pin junction, comprising an n-type layer and a p-type layer being stacked or comprising an n-type layer, an i-type layer, and a p-type layer being stacked; a double cell structure which comprises a stacked body comprising two cell units being stacked, each cell unit having a pn or pin junction and comprising an n-type layer and a p-type layer being stacked or comprising an n-type layer, an i-type layer, and a p-type layer being stacked; or a triple cell structure which comprises a stacked body comprising three cell units being stacked, each cell unit having a pn or pin junction and comprising an n-type layer and a p-type layer being stacked or comprising an n-type layer, an i-type layer, and a p-type layer being stacked.

In order to obtain a large quantity of electric power, it is necessary for the solar cell to have a large area. However, as the area of the solar cell is enlarged, there is a tendency for the photoelectric conversion efficiency decrease. A main reason for this lies in power loss caused due to the electric resistance of the transparent and electrically conductive film. Therefore, the active area of the solar cell is usually decided in relation with the current collecting efficiency of the collecting electrode 305.

However, by precisely patterning the transparent and electrically conductive film, the active area of the solar cell can be increased as desired, where an increase in the power outputted can be attained accordingly.

In the case where when upon patterning the transparent and electrically conductive film by way of the etching treatment, when the transparent and electrically conductive film is not sufficiently etched as desired to cause a breakage at the resulting patterned portion 306, leakage current is generated from shunt portions other than the active area to reduce the photoelectric conversion efficiency. In addition, this defect in the etching of the transparent and electrically conductive film has a negative effect on the initial chracteristics of the solar cell, and it contributes to the occurrence of shunts in reliability testing, where the solar cell has problems in the use in outdoors.

Therefore, it is necessary that a given portion of the transparent and electrically conductive film which is to be etched is entirely removed upon the etching treatment.

In the following, selective etching apparatus suitable for practicing the etching process according to the present will be described invention.

Figure 4:
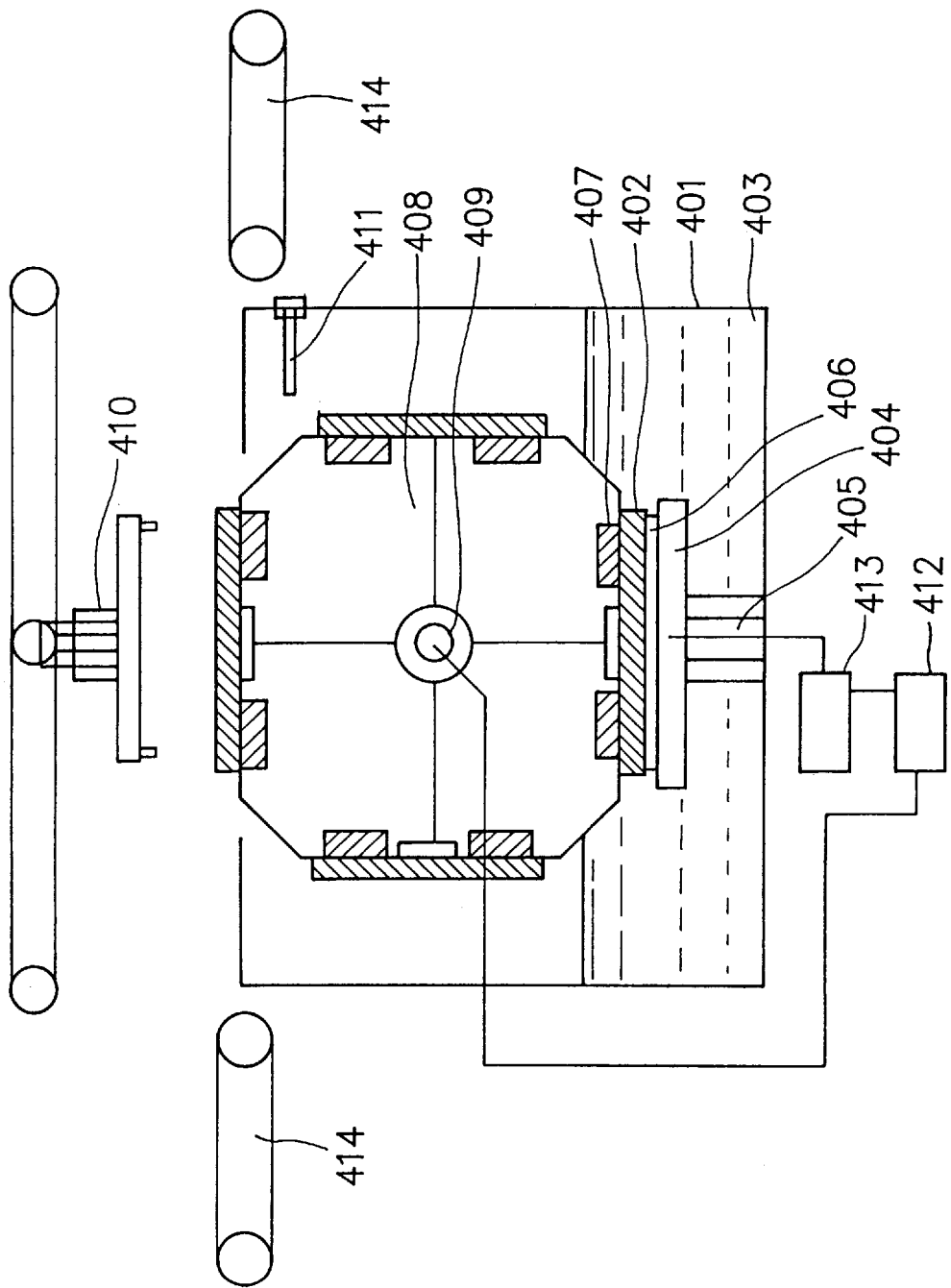
FIG. 4 is a schematic diagram illustrating an example of an apparatus suitable for practicing the process according to the present invention.

FIG. 4 is a schematic diagram illustrating an example of a selective etching apparatus suitable for practicing the etching process according to the present invention.

Figure 5:
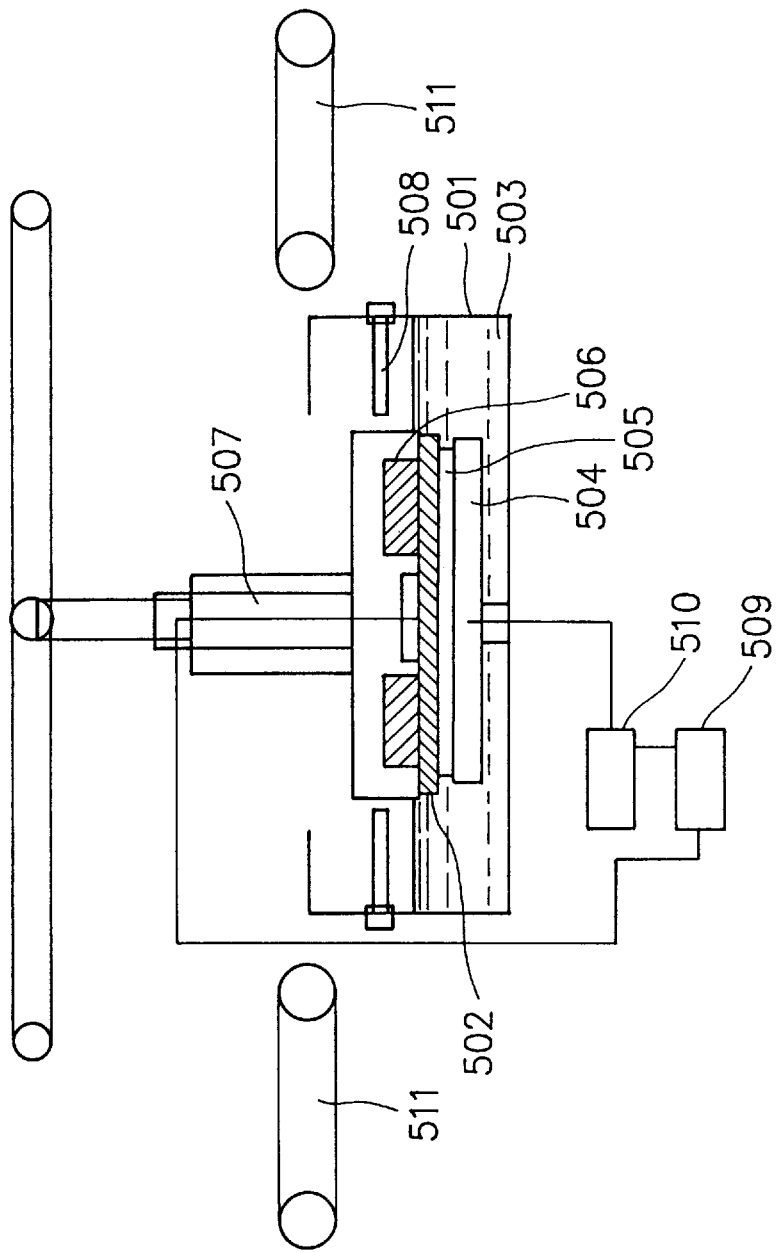
FIG. 5 is a schematic diagram illustrating another example of an apparatus suitable for practicing the process according to the present invention.

FIG. 5 is a schematic diagram illustrating another example of a selective etching apparatus suitable for practicing the etching process according to the present invention.

Description will be made of the apparatus shown in FIG. 4.

The apparatus shown in FIG. 4 is the type that the immersion of a substrate (to be subjected to etching treatment) into an electrolyte solution is conducted in a rotary manner.

In FIG. 4, reference numeral 401 indicates an electrolytic bath, reference numeral 402 a substrate with a portion (for example, comprising a film) to be etched, reference numeral 403 an electrolyte solution, reference numeral 404 a counter electrode shaped in a desired pattern, reference numeral 405 a lifting mechanism for moving the counter electrode 404 up and down, reference numeral 406 a gapping member, reference numeral 407 a substrate holding segment, reference numeral 408 a rotary drum, reference numeral 409 a rotation axis, reference numeral 410 a substrate carrying mechanism, reference numeral 411 a treated liquid removing mechanism, reference numeral 412 a power source, reference numeral 413 a sequence controller, and reference numeral 414 a carriage belt.

The electrolytic bath 401 is made of a material which excels in acid resistance and corrosion resistance, is light and can be readily processed, such as vinyl chloride resin, acrylic resin, or the like.

The rotary drum 408 shown in FIG. 4 is shaped in a tetrahedral form having four faces each serving as the substrate holding segment 407 for holding the substrate 402 thereon. However, the shape of the rotary drum 408 is not limited to this. The rotary drum 408 may be shaped in other appropriate forms having five or more faces each capable of holding a substrate 402 thereon such as a pentahedral form, hexahedral form, and the like.

As shown in FIG. 4, the power source 412 is electrically connected through its negative electrode to the rotation axis 409. The rotation axis is electrically wired to an electrode fixed on the rear side of each face of the rotary drum 408 so that electric current flows to the substrate 402 held on said face of the rotary drum while being immersed in the electrolyte solution 403, where the substrate 402 serves as a negative electrode. The electric current supply electric system herein is desirably designed to be turned on and off.

The counter electrode 404 is held on the lifting mechanism 405. The gapping member 406 is positioned on the counter electrode 404 held on the lifting mechanism 405. The counter electrode 404 is electrically connected to a positive electrode of the power source 412 through the lifting mechanism 405 and the sequence controller 413.

When the rotary drum 408 is rotated to bring the substrate 402 held thereon in to the etching zone so that the substrate 402 is immersed in the electrolyte solution 403 contained in the electrolytic bath 401, the counter electrode 404 is positioned outside the radius of gyration of the rotary drum 408.

In the etching zone, immediately before electric current flows, the lifting mechanism 405 having the counter electrode 404 and the gapping member 406 stacked in the named order thereon is lifted to contact the gapping member 406 with the portion to be etched of the substrate 402, and thereafter, the electric current flows between the counter electrode 404 and the substrate 402 to etch the portion to be etched of the substrate. In this case, the quantity of the electric current flowing and the period of time during which the electric current flows are controlled as desired by means of the sequence controller 413. The electric current may be either direct current or pulse current. After the completion of the etching treatment for the substrate 402, the lifting mechanism 405 having the counter electrode 404 and the gapping member 406 thereon is returned to home position.

The substrate holding segment 407 is provided with an electromagnet (not shown) in order to fasten the substrate 402 positioned thereof by virtue of a magnetic force generated by the electromagnet, where to fix or detach the substrate can be desirably conducted by turning on or off the magnetic force.

The apparatus shown in FIG. 4 may be provided with a mechanism including the electromagnet and a fixing plate, which operates such that upon fastening the substrate 402, the electromagnet closes the fixing plate from the rear side of the substrate and upon detaching the substrate, the electromagnet retreats away from the fixing plate.

The treated liquid removing mechanism 411 serves to remove the electrolyte solution 403 from the surface of the substrate 402 after the etching treatment for the substrate in order to prevent the electrolyte solution from being leaked to the outside. The removal of the electrolyte solution is conducted by way of air-emission from an air-outlet or by means of a brush or blade.

The apparatus shown in FIG. 4 is markedly advantageous in that the substrate 402 to be treated can be continuously introduced to position on each substrate holding segment 407 of the rotary drum 408 having at least four faces as previously described, followed by the etching treatment; the stand-by, etching treatment, liquid removal, and take-out of a product can be continuously conducted without time loss; and the etching treatment of the substrate can be completed for an extremely short period of time.

Description will be made of the apparatus shown in FIG. 5.

The apparatus shown in FIG. 5 is the type that the immersion of a substrate (to be subjected to etching treatment) into an electrolyte solution is conducted by moving the substrate down and up.

In FIG. 5, reference numeral 501 indicates an electrolytic bath, reference numeral 502 a substrate with a portion (for example, comprising a film), reference numeral 503 an electrolyte solution, reference numeral 504 a counter electrode shaped in a desired pattern, reference numeral 505 a gapping member, reference numeral 506 a substrate holding segment provided at a mounting table, reference numeral 507 a lifting mechanism for moving the substrate holding segment 506 down and up, reference numeral 508 a treated liquid removing mechanism, reference numeral 509 a power source, reference numeral 510 a sequence controller, and reference numeral 511 a carriage belt.

The lifting mechanism 507 comprises an air cylinder. It is more effective to use a ball bearing in combination with the air cylinder.

As shown in FIG. 5, the lifting mechanism 507 is connected to the mounting table provided with the substrate holding segment 506 so that the immersion of the substrate 502 into the electrolyte solution 503, the etching treatment of the substrate, and the carriage of the substrate can be conducted for a short period of time by operating the lifting mechanism.

As shown in FIG. 5, the power source 509 is electrically connected to the substrate 502 held on the substrate holding segment 506, and it is also electrically connected to the counter electrode 504 through the sequence controller 510.

In the apparatus shown in FIG. 5, the etching treatment of the substrate 502 is typically conducted as follows. The substrate holding segment 506 having the substrate 502 held thereon moves down to immerse the substrate 502 into the electrolyte solution 503. Then, immediately before electric current flows, the gapping member 506 situated on the counter electrode 504 conducts with the portion to be etched of the substrate 502. Thereafter, the electric current flows between the counter electrode 504 and the substrate 502 to etch the substrate as desired. In this case, the quantity of the electric current and the period of time during which the electric current flows are controlled as desired by means of the sequence controller 510. The electric current may be either direct current or pulse current.

The substrate holding segment 506 is provided with an electromagnet (not shown) in order to fasten the substrate 502 by virtue of a magnetic force generated by the electromagnet, so fixing or detaching the substrate can be desirably conducted by turning on or off the magnetic force.

The treated liquid removing mechanism 508 serves to remove the electrolyte solution 503 from the surface of the substrate 502 after the etching treatment for the substrate in order to prevent the electrolyte solution from leaking to the outside. The removal of the electrolyte solution is conducted by way of air-emission from an air-outlet or by means of a brush or blade.

The apparatus shown in FIG. 5 is also markedly advantageous in that the introduction of the substrate 502 into the electrolytic bath 501 is conducted in the plane direction and therefore, the amount of the electrolytic solution required for the etching treatment of the substrate is small; and the scale of the apparatus can be miniaturized.

In the following, description will be made of the method of eliminating short circuit defects by way of electrolysis in the present invention, while referring to FIGS. 6 and 7.

FIG. 6 is a schematic cross-sectional view illustrating an example of a semiconductor element having short circuit defects. FIG. 7 is a schematic cross-sectional view illustrating an example of a repaired semiconductor element in which said short circuit defects have been eliminated.

In FIG. 6, because defects 1302 (or short circuit defects) are present, short-circuit current paths 1301 extend from a metal substrate 1303 to a transparent and electrically conductive film 1304 while crossing regions of a semiconductor layer 1305. Herein, when forward bias is applied to the substrate side of the semiconductor element in the presence of an electrolyte solution, the involved portions of the transparent and electrically conductive film 1304 are removed until they are electrically insulated from the short-circuit current path 1301. That is, by eliminating the short-circuit current path 1301, the electric resistance of the shortcircuited portion is substantially increased at the interface between the transparent and electrically conductive film and the semiconductor region. The increase in the electric resistance of the shortcircuited portion provides a repaired semiconductor element which is substantially free of the generation of short-circuit current and has a good performance. Particularly, as shown in FIG. 7, the problems of short circuit defects or shunts can be eliminated by removing, of the transparent and electrically conductive film 1304 stacked on the semiconductor layer 1305, its portions present at the peripheries of the defects 1302, whereby eliminating the short-circuit current paths 1301.

For the forward bias applied, it is desired to apply a bias voltage of 2 V to 10 V per one semiconductor element's substrate. As the electrolyte solution used, any electrolyte solutions may be optionally used as long as they have a function of removing a transparent and electrically conductive film as well as in the case of the etching process by way of electrolysis.

The above described short circuit defects-eliminating process is advantageous in that the same electrolyte solution can be used in both the etching process and the short circuit defects-eliminating process and therefore, these two processes can be conducted in the same electrolyte solution; hence, these two processes can be continuously conducted in the same electrolytic bath; and this situation enables mass-production of a semiconductor element such a photovoltaic element (including a solar cell) or the like having a reliable performance at a high yield.

Figure 8:
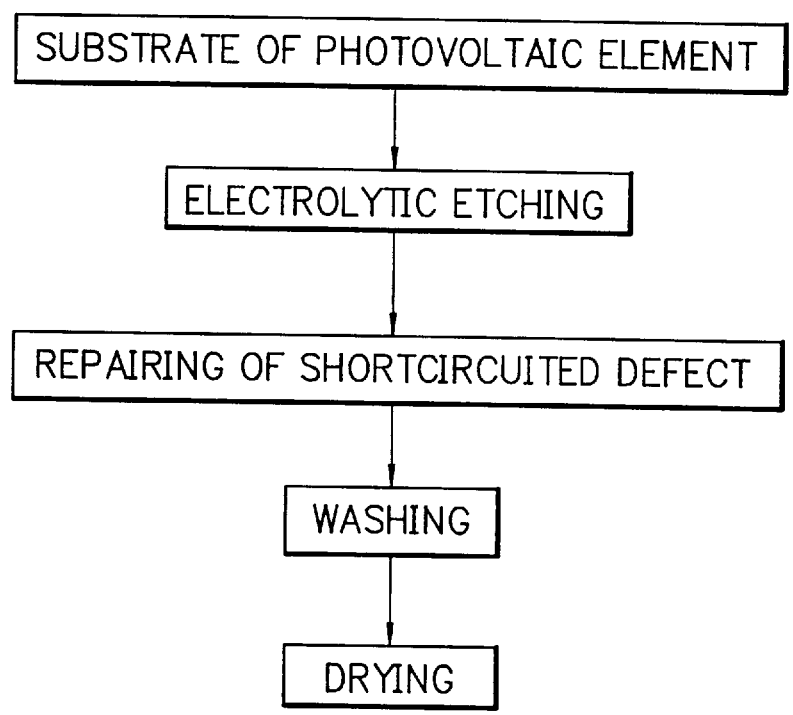
FIG. 8 is a schematic flow chart showing an example of a process for producing a semiconductor element in the present invention.
Figure 9:
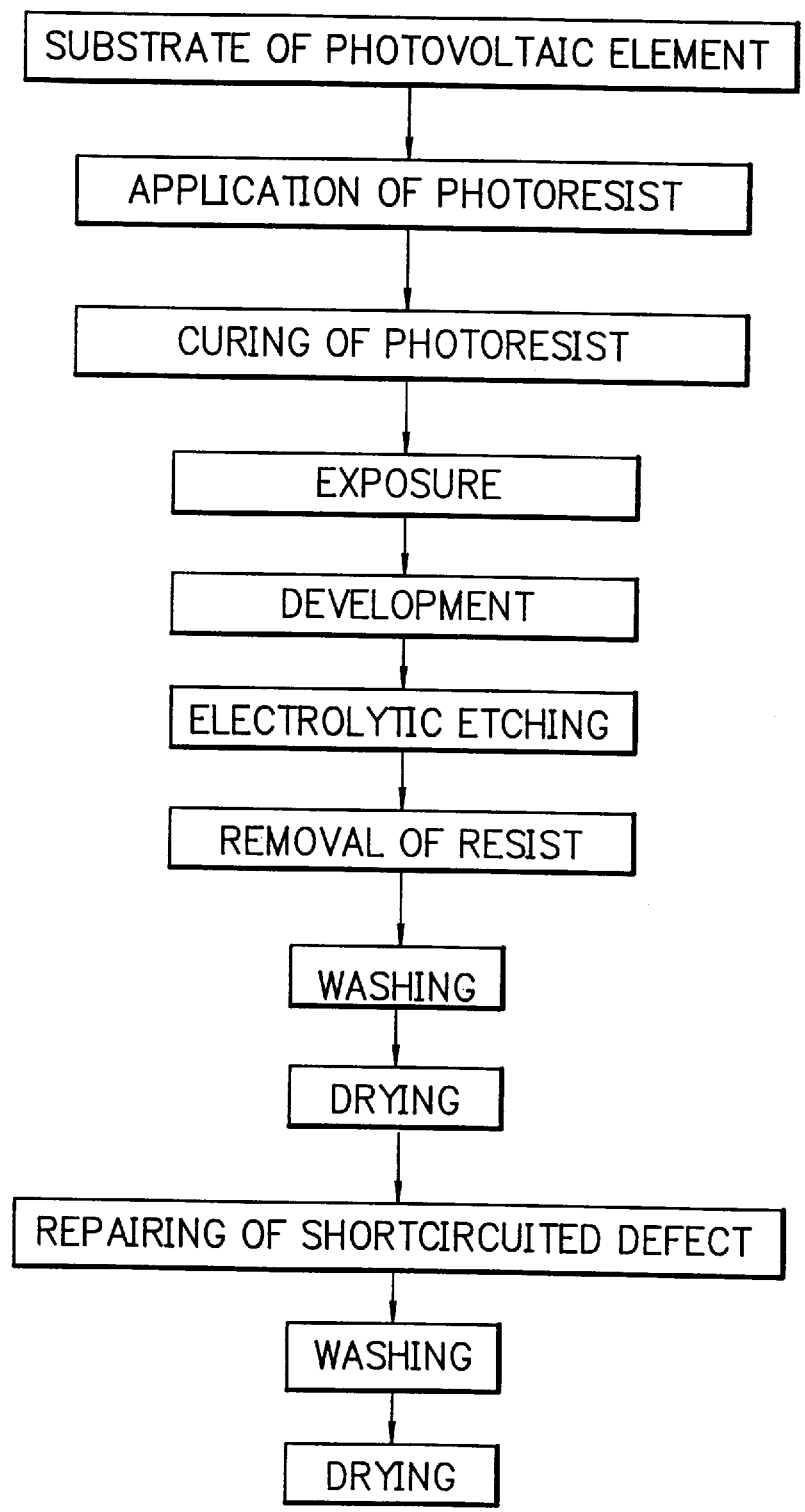
FIG. 9 is a schematic flow chart showing an example of a conventional process by way of photolithography for producing a semiconductor element.

FIG. 8 is a schematic flow chart showing an example of the process according to the present invention for producing a semiconductor element. FIG. 9 is a schematic flow chart showing an example of a conventional process by way of photolithography for producing a semiconductor element. In comparison of the process according to the present invention shown in FIG. 8 with the conventional process shown in FIG. 9, it is clearly understood that the process according to the present invention is apparently simpler than the conventional process.

Figure 10:
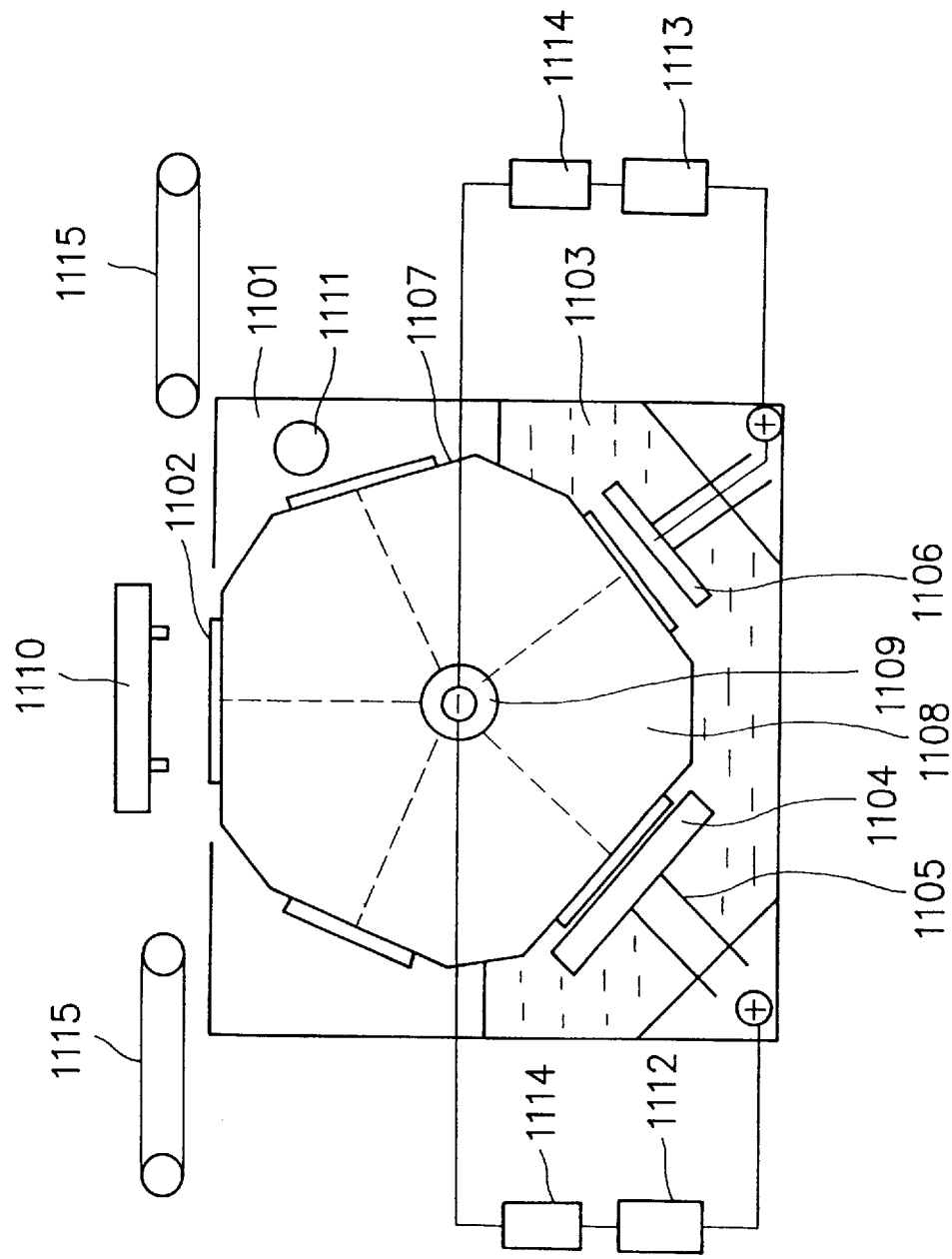
FIG. 10 is a schematic diagram illustrating a further example of a treatment apparatus suitable for practicing the process according to the present invention.

FIG. 10 is a schematic diagram illustrating an example of an apparatus suitable for practicing the process according to the present invention in which the etching process and the short circuit defects-eliminating process are continuously conducted.

In FIG. 10, reference numeral 1101 indicates an electrolytic bath, reference numeral 1102 a photovoltaic element comprising an electrically conductive substrate and a stacked structure with at least a semiconductor layer and a transparent and electrically conductive film disposed on said substrate (this will be hereinafter referred to as element substrate), reference numeral 1103 an electrolyte solution, reference numeral 1104 a first counter electrode shaped in a desired pattern which is used for conducting etching treatment, reference numeral 1105 a lifting mechanism for moving the first counter electrode 1104 up and down (this will be hereinafter referred to as first counter electrode lifting mechanism), reference numeral 1106 a second counter electrode shaped in a desired pattern which is used for conducting short circuit defects-eliminating treatment, reference numeral 1107 a substrate holding segment, reference numeral 1108 a rotary drum shaped in a multi-hedral form having a number of faces each serving as the substrate holding segment 1107, reference numeral 1109 a rotation axis, reference numeral 1110 a substrate carrying mechanism, reference numeral 1111 a treated liquid removing mechanism, reference numeral 1112 a power source for etching process (this will be hereinafter referred to as etching power source), reference numeral 1113 a power source for short circuit defects-eliminating process (this will be hereinafter referred to as defect elimination power source), reference numeral 1114 a sequence controller, and reference numeral 1115 a carriage belt.

In the apparatus shown in FIG. 10, an element substrate 1102 is positioned and held on each substrate holding segment 1107 of the rotary drum 1108, and the rotary drum 1108 is rotated, where the element substrates 1102 are successively immersed into the electrolyte solution 1103, followed by subjecting to etching treatment and then to short circuit defects-eliminating treatment.

The electrolytic bath 1101 is made of a material which excels in acid resistance and corrosion resistance, is light and can be readily processed, such as vinyl chloride resin, acrylic resin, or the like.

The rotary drum 1108 shown in FIG. 10 is shaped in a pentahedral form having five faces each serving as the substrate holding segment 1107 for holding the element substrate 1102 thereon. The shape of the rotary drum 1108 is, however, not limited to this. The rotary drum 1108 may be shaped in other appropriate form, for instance, in a trihedral form particularly in the case where the substrate holding segment 1107 is plane. However, the use of the rotary drum 1108 shaped in the pentahedral form as shown in FIG. 10 is markedly advantageous in that the introduction of the element substrate, stand-by, etching treatment, short circuit defects-removing treatment, liquid removal, and take-out of a product can be continuously conducted without time loss; and the rotary drum 1108 can be miniaturized.

Alternatively, in the case where the element substrate 1102 can be bent, the rotary drum 1108 may be shaped in a round form so that the element substrate can be held thereon in a state with a given curvature. In this case, both the first counter electrode 1104 and the second counter electrode 1106 are necessary to be shaped to have a given curvature.

The electric system in the apparatus is desired to be designed such that the electrically conducting state of each substrate holding segment 1107 of the rotary drum 1108 is turned on upon conducting the etching treatment and also upon conducting the short circuit defects-eliminating treatment. It is turned off when not conducting these treatments.

As shown in FIG. 10, the etching power source 1112 is electrically connected through its negative electrode and the sequence controller 1114 to the rotation axis 1109. Similarly, the defect elimination power source 1113 is electrically connected through its negative electrode and the sequence controller 1114 to the rotation axis 1109. And the rotation axis 1109 is electrically wired to the rear side of each face of the rotary drum 1108 so that electric current flows to the element substrate 1102 held on said face while being immersed in the electrolyte solution 1103, where the element substrate 1102 serves as a negative electrode. The electric current supply electric system herein is desired to be designed such that it can be turned on and off.

The first counter electrode 1104 is held on the first counter electrode lifting mechanism 1105, and it is electrically connected to a positive electrode of the etching power source 1112 through the lifting mechanism 1105. Similarly, The second counter electrode 1106 is held on a second counter electrode lifting mechanism, and it is electrically connected to a positive electrode of the defect elimination power source 1113 through said lifting mechanism.

When the rotary drum 1108 is rotated, the first counter electrode 1104 is positioned outside the radius of gyration of the rotary drum 1108, where immediately before electric current flows, the first counter electrode is positioned in close proximity to the element substrate 1102, and thereafter, the electric current flows between the first counter electrode 1104 and the element substrate 1102 to etch a given portion of the element substrate 1102. In this case, the quantity of the electric current and the period of time during which the electric current flows are controlled as desired by means of the sequence controller 1114. The electric current may be either direct current or pulse current.

The first counter electrode 1104 is shaped in a desired pattern as above-described. In the etching treatment, electrochemical reaction is caused by converging the electric current to the electrode. It is desired for the first counter electrode to function to always attain a uniform patterning line. In view of this, the first counter electrode 1104 is desired to be constituted by a material having high durability such as platinum, gold, or carbon.

In the short circuit defects-eliminating treatment, the second counter electrode 1106 is positioned so as to maintain a predetermined parallel interval to the element substrate 1102, and a given forward bias is applied to the element substrate 1102 side, whereby to eliminate short circuit defects present in the element substrate is conducted. In this case, as well as in the case of the etching treatment, the quantity of the electric current and the period of time during which the electric current flows are controlled as desired by means of the sequence controller 1114.

It is possible to install a mechanism capable of adjusting the interval between the second counter electrode 1106 and the element substrate 1102 on the side of the second counter electrode 1106.

The second counter electrode 1106 may be constituted by platinum, carbon, gold, stainless steel, nickel, copper, or lead. In the case where the second counter electrode 1106 is required to excel particularly in dissolution resistance, it is desired to be constituted by platinum which is chemically stable and can be readily processed into a desired pattern.

The substrate holding segment 1107 is provided with an electromagnet (not shown) in order to fasten the element substrate 1102 positioned thereof by virtue of a magnetic force generated by the electromagnet, where to fix or detach the substrate can be desirably conducted by turning on or off the magnetic force.

The apparatus shown in FIG. 10 may be provided with a mechanism including the electromagnet and a fixing plate, which operates such that upon fastening the element substrate 1102, the electromagnet closes the fixing plate from the rear side of the element substrate and upon detaching the substrate, the electromagnet retreats away from the fixing plate.

The treated liquid removing mechanism 1111 serves to remove the electrolyte solution 1103 from the surface of the element substrate 1102 after the etching treatment and short circuit defects-eliminating treatment for the element substrate in order to prevent the electrolyte solution from being leaked to the outside. The removal of the electrolyte solution is conducted by way of air-emission from an air-outlet or by means of a brush or blade.

The apparatus shown in FIG. 10 is markedly advantageous in that the element substrate 1102 to be treated can be continuously introduced to position on each substrate holding segment 1107 of the rotary drum 1108, followed by the etching treatment and then the short circuit defects-eliminating treatment; the introduction of the element substrate to be treated, stand-by, etching treatment, short circuit defects-eliminating treatment, liquid removal, and take-out of a product can be continuously conducted without time loss; and the etching treatment and short circuit defects-eliminating treatment of the element substrate can be continuously completed for an extremely short period of time.

In the following, the present invention will be described in more detail with reference to examples which are not intended to restrict the scope of the present invention.

EXAMPLE 1

In this example, there were prepared 100 p-i-n junction single cell type amorphous solar cells having the constitution shown in FIGS. 3(*a*) and 3(*b*) while patterning their transparent and electrically conductive films using the etching apparatus shown in FIG. 4 in the following manner.

1. Preparation of photovoltaic element:

There was first provided a stainless steel SUS430BA plate (trademark name) as the substrate 301. The stainless steel plate was degreased and then well washed.

On the stainless steel plate thus well cleaned as the substrate 301, there was formed a two-layered lower electrode layer 302 comprising a 4000 Å thick Ag film and a 4000 Å thick ZnO film by means of the conventional sputtering process. Succesively, on the lower electrode layer 302, there was formed a p-i-n junction single cell type photoelectric conversion semiconductor layer 303 with a n-i-p structure comprising a 250 Å thick n-type layer/a 4000 Å thick i-type layer/a 100 Å thick p-type layer being stacked in the named order from the substrate side by means of the conventional RF plasma CVD process, wherein an n-type a-Si film as the n-type layer was formed from a mixture of $SiH_4$ gas, $PH_3$ gas and $H_2$ gas; an i-type a-Si film as the i-type layer was formed from a mixture of $SiH_4$ gas and $H_2$ gas; and a p-type μc-Si film as the p-type layer was formed from a mixture of $SiH_4$ gas, $BF_3$ gas and $H_2$ gas. Then, on the photoelectric conversion semiconductor layer 303, there was formed a 700 Å thick $In_2O_3$ film as the transparent and electrically conductive film 304 (having a function of preventing the occurrence of light reflection) by means of the conventional heat resistance evaporation process wherein an In-source was evaporated at 190° C. in an $O_2$ atmosphere. Thus, there was obtained a photovoltaic element.

The resultant photovoltaic element was cut through its substrate to obtain 100 photovoltaic element of 31 cm×31 cm in size (these photovoltaic elements will be hereinafter referred to as element substrates).

2. Patterning treatment (etching treatment) for the transparent and electrically conductive film of the photovoltaic element:

The patterning treatment was conducted using the etching apparatus shown in FIG. 4.

One of the 100 element substrates obtained in the above step 1 was placed on one of the two carriage belts 414 (made of a rubber) of the etching apparatus shown in FIG. 4 such that the substrate of the element substrate was contacted with the surface of the carriage belt 414. The substrate carrying mechanism 410 (provided with a suction pat) was horizontally moved to reach the carriage belt 414 having the element substrate placed thereon and to take up the element substrate from the carriage belt 414. Then, the substrate carrying mechanism 410 having the element substrate was horizontally returned and it was lowered to unload the element substrate (402) such that it was positioned on the substrate holding segment 407 of the tetrahedral-shaped rotary drum 408. After this, the substrate carrying mechanism 410 was returned to home position.

Incidentally, on the carriage belt 414 from which the element substrate (402) was taken up, the following element substrate was placed to stand by for the next treatment turn.

After the element substrate (402) was positioned on the substrate holding segment 407 of the tetrahedral-shaped rotary drum 408, the electromagnet (not shown in the figure, but previously explained) was raised to fasten the element substrate (402) held on the substrate holding segment 407 by virtue of a magnetic force generated by the electromagnet. Thereafter, the rotary drum 408 was rotated to arrive the element substrate (402) held on the substrate holding segment 407 in the etching treatment zone, where the element substrate (402) held on the substrate holding segment 407 was immersed in the electrolyte solution 403 contained in the electrolytic bath 401. As the electrolyte solution 403, an electrolyte solution containing 8 wt. % of a hexahydrate of aluminum chloride as an electrolyte dissolved therein and having an electric conductivity of 65.0 mS/cm$^2$ was used, and it was maintained at 25° C. Herein, the revolution of the rotary drum 408 was suspended.

Incidentally, as the rotary drum 408 was rotated as above-described, the substrate carrying mechanism was operated to take up the following element substrate from the carriage belt 414 and to unload it such that it was positioned on the following substrate holding segment 407, and the element substrate was fastened so that it was surely held on the substrate holding segment, in the same manner as in the case of the former element substrate (402). Thereafter, on the carriage belt 414 from which the latter element substrate was taken up, the following element substrate was placed to stand by for the next treatment turn.

Now, when the element substrate (402) was arrived in the etching treatment zone and it was immersed in the electrolyte solution, the lifting mechanism 405 having the counter electrode 404 and the gapping member 406 comprising a 1 mm thick silicone rubber member stacked in the named order on the surface thereof was lifted to contact the gapping member 406 with the transparent and electrically conductive film of the element substrate (402) held on the substrate holding segment 407.

Herein, as the counter electrode 404, there was used a patterned counter electrode comprising a platinum plate with a 1 mm thick silicone rubber film bonded to cover the entire of a surface of said platinum plate and having a square groove of 30 cm×30 cm in size and 0.5 mm in width formed through the silicone rubber film such that the platinum plate is exposed in the square groove and the remaining rear and side faces of the platinum plate being insulated by an insulating film.

Then, the power source 412 was switched on to apply a direct current of 25 A between the counter electrode 404 and the element substrate (402) for 0.5 second while controlling by the sequence controller 413. After this, the lifting mechanism 405 was returned to home position together with the gapping member 406 and the counter electrode 404.

Then, the rotary drum 408 was again rotated, during which when the element substrate (402) held on the substrate holding segment 407 passed by the treated liquid removing mechanism 411, air was sprayed against the element substrate (402) by operating the treated liquid removing mechanism to remove the electrolyte solution deposited on the element substrate.

Thereafter, when the substrate holding segment 407 (having the element substrate (402) free of the electrolyte solution held thereon) of the rotary drum 408 was returned to the starting position, the revolution of the rotary drum 408 was suspended, and the electromagnet was removed from the element substrate.

Successively, the substrate carrying mechanism 410 was lowered to reach the element substrate (402) on the substrate holding segment 407 of the rotary drum 408 to take up the element substrate (402) from the rotary drum 408 and to unload the element substrate (402) on the other carriage belt 414. This carriage belt was operated to carry the element substrate (402) outside the apparatus. Thus, there was obtained a photovoltaic element having a patterned transparent and electrically conductive film. The time required for the patterning treatment was 10 seconds.

The successive element substrates each held on the substrate holding segment 407 were continuously treated in the same manner as in the case of the above element substrate (402).

By this, the 100 photovoltaic elements obtained in the above step 1 were continuously treated to obtain 100 patterned photovoltaic elements having a patterned transparent and electrically conductive film.

3. Preparation of solar cell:

Using the 100 patterned photovoltaic elements obtained in the above step 2, 100 solar cells were prepared in the following manner.

Each photovoltaic element was well washed with pure water, followed by drying.

On the patterned transparent and electrically conductive film 304 of the photovoltaic element thus cleaned, an Ag-paste was applied by means of screen printing, followed by drying, to thereby form a grid electrode as the collecting electrode 305. A copper tub as the positive side power outputting terminal 307 was connected to the grid electrode as the collecting electrode 305 using an Ag-paste, and a tin foil tape as the negative side power outputting terminal 308 was connected to the rear side of the substrate 301 using a solder. Thus, there was obtained a solar cell. In this way, there were obtained 100 solar cells.

EVALUATION

For each of the resultant solar cells, evaluation was conducted as follows.

(1). Evaluation was conducted with respect to initial characteristics in the following manner.

The voltage-current characteristics (V-I characteristics) in dark state were measured by the conventional V-I characteristics measuring manner, and based on the gradient near the origin in the resultant curve, there was obtained a shunt resistance. A mean value among the shunt resistances obtained for the 100 solar cells was calculated to be 80 k$\Omega$.cm$^2$. All the solar cells were found to be free of a shunt created.

(2). Evaluation was conducted with respect to photoelectric conversion efficiency in a manner of measuring solar cell characteristics of each solar cell using a solar cell simulator having a pseudo sunlight source with an AM 1.5 global sunlight spectra and capable of providing a light quantity of 100 mW/cm$^2$ (produced by SPIRE Company) and obtaining a photoelectric conversion efficiency based on the measured solar cell characteristics. As a result, all the solar cells were found to have a satisfactory photoelectric conversion efficiency in the range of 7.0±0.2%.

Successively, for each solar cell, the portions patterned by the etching treatment were examined by means of a microscope. As a result, the 100 solar cells were almost found to be free of disconnection and defectively etched portion and to have a uniformly etched line. The yield was found to be 95%.

(3). Using some of the 100 solar cells and in accordance with a conventional process for producing a solar cell module by way of the conventional thermocompression lamination treatment, there were obtained a plurality of solar cell modules. For each of the resultant solar cell modules, a reliability test was conducted based on the temperature and humidity cycle test A-2 prescribed in the JIS C8917 concerning the environmental test and endurance test for crystalline series solar cell modules. Particularly, the solar cell module was placed in a thermo-hygrostat capable of optionally controlling the related temperature and humidity, where the solar cell module was subjected to alternate repetition of a cycle of exposing to an atmosphere of −40° C. for an hour and a cycle of exposing to an atmosphere of 85° C./85%RH for an hour, 20 times. Thereafter, using the solar cell simulator described in the above (2), its photoelectric conversion efficiency was examined in the same manner as in the above (2). The examined photoelectric conversion efficiency was compared with that obtained in the above (2) to observe a deterioration proportion in terms of the photoelectric conversion efficiency for each solar cell module. A mean value among the deterioration proportions obtained for all the solar cell modules was calculated to be about 2.0% which is satisfactory.

From the evaluated results above described, the following facts are understood. That is, the patterning precision by the foregoing etching treatment is good, and all the solar cells produced by way of the patterning by the foregoing etching treatment are good in initial characteristics and highly reliable. In addition, it is understood that the process according to the present invention enables mass production of a highly reliable solar cell without conducting any provisional step before and after the etching treatment by way of electrolysis, and at an improved treatment speed and with a short period of time required for the etching treatment.

COMPARATIVE EXAMPLE 1

In this comparative example, there were prepared 100 p-i-n junction single cell type amorphous solar cells having the constitution shown in FIGS. 3(a) and 3(b) while patterning their transparent and electrically conductive film by the conventional patterning process by way of photolithography and electrolysis etching.

1. Preparation of photovoltaic element:

In accordance with the procedures for the preparation of a photovoltaic element, described in the step 1 (preparation of photovoltaic element) of Example 1, there were prepared 100 photovoltaic elements.

2. Patterning treatment by way of photolithography and electrolysis etching for the transparent and electrically conductive film of the photovoltaic element:

The patterning treatment for the transparent and electrically conductive film of each of the photovoltaic elements obtained in the above step 1 was conducted in the accordance with the conventional patterning process previously described with reference to FIGS. 1(a) through 1(h).

That is, for each photovoltaic element, on the transparent and electrically conductive film thereof, a resist was formed by applying a coating composition comprising a photosensitive resin and subjecting to drying. Then, a mask pattern having a square pattern of 30 cm×30 cm in size and 0.5 mm in width was arranged on the resist, followed by subjecting to irradiation of ultraviolet rays. The resultant was developed using a developer, followed by washing and rinsing, and then followed by drying, to thereby obtain a patterned product (hereinafter referred to as element substrate). The element substrate was subjected to etching treatment in a conventional etching vessel containing a counter electrode and an etching solution comprising an electrolyte solution containing 8 wt. % of a hexahydrate of aluminum chloride as an electrolyte dissolved therein and having an electric conductivity of 65.0 mS/cm$^2$ (which is the same as in Example 1), followed by washing and then drying. Thereafter, the remaining photomask on the element substrate was eluted with ethanol to remove, followed by washing and then drying. Thus, there was obtained a photovoltaic element having a patterned transparent and electrically conductive film.

By repeating the above procedures, there were obtained 100 patterned photovoltaic elements having a patterned transparent and electrically conductive film.

3. Preparation of solar cell:

Using the 100 patterned photovoltaic elements obtained in the above step 2, 100 solar cells were prepared in accordance with the procedures described in the step 3 (preparation of solar cell) in Example 1.

EVALUATION

The resultant 100 solar cells were evaluated in the same evaluation manner as in Example 1.

(1). For each solar cell, evaluation with respect to initial characteristics was conducted in the same manner as in Example 1. As a result, 10 of the 100 solar cells were found to have a shunt resistance of 10 kΩ.cm$^2$.

(2). For each solar cell, evaluation with respect to photoelectric conversion efficiency was conducted in the same manner as in Example 1.

As a result, all the solar cells were found to have a photoelectric conversion efficiency varied in the range of 5.3±1.8%. And some of the solar cells were found to have shunts created.

And for each solar cell, the patterned portions were examined by means of a microscope. As a result, the solar cells were almost found to have disconnections. It is considered that this disconnection problem occurred due to insufficiency in the removal of the photomask upon the patterning by the irradiation of ultraviolet rays.

And for the solar cells having a inferior photoelectric conversion efficiency and shunts created, they were found to have an uneven patterned line with an undesirably large width. The reason for this is considered such that the adhesion between the photoresist film and the transparent and electrically conductive film was insufficient and the portion of the transparent and electrically conductive film situated on the counter electrode side was not patterned, and because of this, the line of electric force could not be desirably controlled to result in causing side etching or overetching.

EXAMPLE 2

In this example, there were prepared 100 p-i-n Junction triple cell type amorphous solar cells having the constitution shown in FIGS. 3(a) and 3(b) while patterning their transparent and electrically conductive films using the etching apparatus shown in FIG. 4 in the following manner.

1. Preparation of photovoltaic element:

There was first provided a stainless steel SUS430BA plate (trademark name) as the substrate 301. The stainless steel plate was degreased and then well washed.

On the stainless steel plate thus well cleaned as the substrate 301, there was formed a two-layered lower electrode layer 302 comprising a 4000 Å thick Ag film and a 4000 Å thick ZnO film by means of the conventional sputtering process. Successively, on the lower electrode layer 302, there was formed a p-i-n junction triple cell type photoelectric conversion semiconductor layer 303 with a n-i-p/n-i-p/n-i-p structure having a bottom cell comprising a 250 Å thick n-type layer/a 1050 Å thick i-type layer/a 100 Å thick p-type layer, a middle cell comprising a 600 Å thick n-type layer/a 1450 Å thick i-type layer/a 100 Å thick p-type layer, and a top cell comprising a 100 Å thick n-type layer/a 1000 Å thick i-type layer/a 100 Å thick p-type layer being stacked in the named order from the substrate side by means of the conventional microwave plasma CVD, wherein an n-type a-Si film as the n-type layer was formed from a mixture of $SiH_4$ gas, $PH_3$ gas and $H_2$ gas; an i-type a-Si film as the i-type layer was formed from a mixture of $SiH_4$ gas and $H_2$ gas; and a p-type $\mu$c-Si film as the p-type layer was formed from a mixture of $SiH_4$ gas, $BF_3$ gas and $H_2$ gas. Then, on the photoelectric conversion semiconductor layer 303, there was formed a 730 Å thick ITO film as the transparent and electrically conductive film 304 (to prevent light reflection) by means of the conventional sputtering process wherein a target comprising In and Sn was sputtered at 170° C. in an $O_2$ atmosphere. Thus, there was obtained a photovoltaic element.

The resultant photovoltaic element was cut through its substrate to obtain 100 photovoltaic elements of 31 cm×31 cm in size.

2. Patterning treatment (etching treatment) for the transparent and electrically conductive film of the photovoltaic element:

For the 100 photovoltaic elements obtained in the above step 1, the patterning treatment was conducted in the same manner as in the step 2 of Example 1.

Particularly, the 100 photovoltaic elements obtained in the above step 1 were successively introduced into the etching apparatus shown in FIG. 4 and they were continuously subjected to patterning treatment in the same manner as in the step 2 of Example 1, to thereby obtain 100 patterned photovoltaic elements having a patterned transparent and electrically conductive film.

3. Preparation of solar cell:

Using the 100 patterned photovoltaic elements obtained in the above step 2, 100 solar cells were prepared in accordance with the procedures described in the step 3 (preparation of solar cell) in Example 1.

EVALUATION

The resultant 100 solar cells were evaluated in the same evaluation manner as in Example 1.

(1). For each solar cell, evaluation with respect to initial characteristics was conducted in the same manner as in Example 1.

As a result, the mean value among the shunt resistances obtained for the 100 solar cells was found to be 90 k$\Omega$.cm$^2$. All the solar cells were found to be free of a shunt.

(2). For each solar cell, evaluation with respect to photoelectric conversion efficiency was conducted in the same manner as in Example 1.

As a result, all the solar cells were found to have a satisfactory photoelectric conversion efficiency in the range of 9.0±0.2%.

Successively, for each solar cell, the portions patterned by the etching treatment were examined by means of a microscope. As a result, the 100 solar cells were found to be almost free of disconnection and defectively etched portions and to have a uniformly etched line. The yield was found to be 95%.

(3). Using some of the 100 solar cells, and in accordance with a conventional process for producing a solar cell module by way of the conventional thermocompression lamination treatment, there were obtained a plurality of solar cell modules. For the resultant solar cell modules, reliability testing was conducted in the same manner as in Example 1. As a result, the mean value among the deterioration proportions obtained for all the solar cell modules was found to be about 2.1% which is satisfactory.

From the results above-described, the following facts are understood. That is, the patterning precision by the foregoing etching treatment is, good and all the solar cells produced by way of the patterning by the foregoing etching treatment are good in initial characteristics and highly reliable. In addition, it is understood that the process according to the present invention enables mass-production of a highly reliable solar cell without conducting any provisional step before and after the etching treatment by way of electrolysis, and at an improved treatment speed and with a short period of time required for the etching treatment.

EXAMPLE 3

In this example, there were prepared 100 p-i-n junction single cell type amorphous solar cells having the constitution shown in FIGS. 3(a) and 3(b), while patterning their transparent and electrically conductive films using the etching apparatus shown in FIG. 5 in the following manner.

1. Preparation of photovoltaic element:

In accordance with the procedures for the preparation of a photovoltaic element, described in the step 1 (preparation of photovoltaic element) of Example 1, there were prepared 100 p-i-n junction single cell type photovoltaic elements (these photovoltaic elements will be hereinafter referred to as element substrates).

2. Patterning treatment for the transparent and electrically conductive film of the photovoltaic element:

The patterning treatment was conducted using the etching apparatus shown in FIG. 5.

One of the 100 element substrates obtained in the above step 1 was placed on one of the two carriage belts 511 (made of a rubber) of the etching apparatus shown in FIG. 5 such that the substrate thereof was contacted with the surface of the carriage belt 511. The lifting mechanism 507 provided with the mounting table having the substrate holding segment 506 was horizontally moved to reach the carriage belt 511 having the element substrate placed thereon and to take up the element substrate on the carriage belt 511 by virtue of a magnetic force generated by energizing the electromagnet (not shown) provided at the substrate holding segment 506 such that the element substrate (502) was positioned on the substrate holding segment 506. After this, the lifting mechanism 507 was horizontally returned and it was lowered to immerse the substrate holding segment 506 having the element substrate (502) held thereon into the electrolyte solution 503 contained in the electrolytic bath 501. As the electrolyte solution 503, an electrolyte solution containing 10 wt. % of a hexahydrate of potassium chloride as an electrolyte dissolved therein and having an electrical conductivity of 50.0 mS/cm$^2$ was used, and it was maintained at 25° C. Successively, the lifting mechanism 507 was further lowered so that the transparent and electrically conductive film of the element substrate (502) was contacted with the gapping member 505 comprising a 1 mm thick silicone rubber member stacked on the counter electrode 504.

As the counter electrode 504 there was used a patterned counter electrode comprising a platinum plate with a 1 mm thick silicone rubber film bonded to cover the entire surface of said platinum plate and having a square groove of 30 cm×30 cm in size and 0.5 mm in width formed through the silicone rubber film such that the platinum plate is exposed in the square groove. The remaining rear and side faces of the platinum plate are insulated by an insulating film.

Then, the power source 509 was switched on to apply a direct current of 30 A between the counter electrode 504 and the element substrate (502) for 0.4 second while being controlled 3. by the sequence controller 510. After this, the lifting mechanism 507 was lifted. When the element substrate (502) held on the substrate holding segment 506 of the mounting table passed by the treated liquid removing mechanism 508, air was sprayed against the element substrate (502) by operating the treated liquid removing mechanism to remove the electrolyte solution deposited on the element substrate.

After the lifting mechanism 507 was lifted until the element substrate (502) held on the substrate holding segment 506 of the mounting table was situated above the electrolytic bath 501, the lifting mechanism was horizontally moved to reach the other carriage belt 511, where the magnetic force of fixing the element substrate (502) to the surface of the substrate holding segment 506 of the mounting table was unloaded on the carriage belt 511 by turning off the electromagnet. This carriage belt was operated to carry the treated element substrate outside the apparatus. Thus, there was obtained a photovoltaic element having a patterned transparent and electrically conductive film. The time required for the patterning treatment was 10 seconds.

The above procedures were continuously repeated. By this, the 100 photovoltaic elements obtained in the above step 1 were continuously treated to obtain 100 patterned photovoltaic elements having a patterned transparent and electrically conductive film.

3. Preparation of solar cell:

Using the 100 patterned photovoltaic elements obtained in the above step 2, 100 solar cells were prepared in accordance with the procedures described in the step 3 (preparation of solar cell) in Example 1.

EVALUATION

The resultant 100 solar cells were evaluated in the same evaluation manner as in Example 1.

(1). For each solar cell, evaluation with respect to initial characteristics was conducted in the same manner as in Example 1.

As a result, the mean value among the shunt resistances obtained for the 100 solar cells was found to be 85 $\Omega.cm^2$. From this, it was found that all the solar cells are free of the occurrence of a shunt.

(2). For each solar cell, evaluation with respect to photoelectric conversion efficiency was conducted in the manner as in Example 1.

As a result, all the solar cells were found to have a satisfactory photoelectric conversion efficiency in the range of 7.1±0.3%.

Successively, for each solar cell, the portions patterned by the etching treatment were examined by means of a microscope. As a result, the 100 solar cells were found to be almost free of disconnection and defectively etched portions and to have a uniformly etched line. The yield was found to be 97%.

(3). Using some of the 100 solar cells and in accordance with a conventional process for producing a solar cell module by way of the conventional thermocompression lamination treatment, there were obtained a plurality of solar cell modules. For the resultant solar cell modules, reliability testing was conducted in the same manner as in Example 1. As a result, the mean value among the deterioration proportions obtained for all the solar cell modules was found to be about 1.8%, which is satisfactory.

From the results above-described, the following facts are understood. That is, the patterning precision by the foregoing etching treatment is good, and all the solar cells produced by way of the patterning by the foregoing etching treatment are good in initial characteristics and highly reliable. In addition, it is understood that the process according to the present invention enables mass-production of a highly reliable solar cell without conducting any provisional step before and after the etching treatment by way of electrolysis, and at an improved treatment speed and with a short period of time required for the etching treatment.

EXAMPLE 4

In this example, as an example of etching a metallic electrically conductive film, the patterning for a distributing circuit on a wafer used in an IC was conducted as follows.

A 1000 Å thick Ti—W metal layer was deposited on a wafer by the conventional sputtering process, followed by depositing a 1 μm thick aluminum metal layer on the Ti—W metal layer by the conventional sputtering process, to obtain an element body. In this way, there were obtained a plurality of element bodies.

The resultant element bodies were subjected to patterning treatment in accordance with the patterning procedures using the etching apparatus shown in FIG. 4, described in the step 2 of Example 1 except for replacing the counter electrode 404 used in Example 1 by a counter electrode obtained by modifying the counter electrode 404 to have a pattern corresponding to a desired distributing circuit pattern, wherein the element bodies were continuously subjected to etching treatment in the same manner as in Example 1 to etch their aluminum metal layers. patterned element bodies have a pattern corresponding to the distributing circuit pattern of the counter electrode were obtained.

For each of the resultant patterned element bodies, the patterned portions were examined by means of a microscope. As a result, all the patterned element bodies were found to free of disconnections and defectively etched portions. The distributing circuit pattern of each of the resultant patterned element bodies, its electric behavior was examined. As a result, no anomalous electric behavior was observed for all the patterned element bodies.

Based on the above results, it is understood that the patterning precision by the etching treatment according to the present invention is good and that the present invention enables efficient mass-production of a highly reliable distributing circuit pattern for ICs.

EXAMPLE 5

In this example, there were prepared 100 p-i-n junction single cell type amorphous solar cells having the constitution shown in FIGS. 3(a) and 3(b) while patterning their transparent and electrically conductive films and eliminating short circuit defects possibly created in the fabrication of said amorphous solar cell, using the apparatus shown in FIG. 10 capable of continuously conducting the etching process and the short circuit defects-eliminating process, in the following manner.

1. Preparation of photovoltaic element:

In accordance with the procedures for the preparation of a photovoltaic element, described in the step 1 (preparation of photovoltaic element) of Example 1, there were prepared 100 photovoltaic elements (these photovoltaic elements will be hereinafter referred to as element substrates).

2. Etching treatment and short circuit defects-eliminating treatment:

The etching treatment and short circuit defects-eliminating treatment were continuously conducted using the apparatus shown in FIG. 10.

One of the 100 element substrates obtained in the above step 1 was placed on one of the two carriage belts 1115 (made of a rubber) of the apparatus shown in FIG. 10 such that the substrate thereof was contacted with the surface of the carriage belt 1115. The substrate carrying mechanism 1110 (provided with a suction pat) was horizontally moved to reach the carriage belt 1115 having the element substrate placed thereon and to take up the element substrate from the carriage belt 1115. Then, the substrate carrying mechanism 1110 was horizontally returned and it was lowered to unload the element substrate (1102) such that it was positioned on the substrate holding segment 1107 of the pentahedral-shaped rotary drum 1108.

Incidentally, on the carriage belt 1115 from which the element substrate (1102) was taken up, the following element substrate was placed to stand-by for the next treatment.

After the the element substrate (1102) was positioned on the substrate holding segment 1107 of the rotary drum 1108 as above described, the substrate carrying mechanism 1110 was returned to home position. Thereafter, the electromagnet (not shown in the figure, but previously explained) was raised to fasten the element substrate (1102) held on the substrate holding segment 1107 by virtue of a magnetic force generated by the electromagnet. Thereafter, the rotary drum 1108 was rotated to bring the element substrate (1102) held on the substrate holding segment 1107 to the etching treatment zone, where the element substrate (1102) held on the substrate holding segment 1107 was immersed in the electrolyte solution 1103 contained in the electrolytic bath 1101. As the electrolyte solution 1103, an electrolyte solution containing 8 wt. % of a hexahydrate of aluminum chloride as an electrolyte dissolved therein and having an electric conductivity of 65.0 mS/cm$^2$ was used, and it was maintained at 25° C. Herein, the revolution of the rotary drum 1108 was suspended.

Incidentally, as the rotary drum 1108 was rotated as above described, the substrate carrying mechanism 1110 was operated to take up the following element substrate from the carriage belt 1115 and to unload it such that it was positioned on the following substrate holding segment 1107, and the the element substrate was fastened so that it was securely held on the substrate holding segment, in the same manner as in the case of the former element substrate (1102). Thereafter, on the carriage belt 1115 from which the latter element substrate was taken up, the following element substrate was placed to stand by for the next treatment.

Now, when the element substrate (1120) was brought to the etching treatment zone and it was immersed in the electrolyte solution, the lifting mechanism 1105 having the counter electrode 1104 and a 1 mm thick silicone rubber gapping member (not shown) stacked in the named order on the surface thereof, was lifted to contact the gapping member with the transparent and electrically conductive film of the element substrate (1102) held on the substrate holding segment 1107.

Herein, as the counter electrode 1104, there was used a patterned counter electrode comprising a platinum plate with a 1 mm thick silicone rubber film bonded to cover the entire of a surface of said platinum plate and having a square groove of 30 cm×30 cm in size and 0.5 mm in width formed through the silicone rubber film such that the platinum plate is exposed in the square groove and the remaining rear and side faces of the platinum plate are insulated by an insulating film.

Then, the power source 1112 was switched on to apply a direct current of 25 A between the counter electrode 1104 and the element substrate (1102) for 0.5 second while being controlled by the sequence controller 1114.

After this, the lifting mechanism 1105 was returned to home position together with the gapping member and the counter electrode 1104.

Then, the rotary drum 1108 was again rotated to reach the zone for conducting the short circuit defects-eliminating treatment. The revolution of the rotary drum 1108 was suspended. In this zone, the power source 1113 was switched on to apply a D.C. bias voltage of 4.5 V between the counter electrode 1106 and the element substrate (1102) while controlling by the sequence controller 1114. In this case, the counter electrode 1106 was positioned in parallel to the element substrate (1102) while maintaining an interval of 4.0 cm between the two.

Successively, the rotary drum 1108 was rotated, during which when the element substrate (1102) held on the substrate holding segment 1107 passed by the treated liquid removing mechanism 1111, air was sprayed against the element substrate (1102) by operating the treated liquid removing mechanism to remove the electrolyte solution deposited on the element substrate.

Thereafter, when the substrate holding segment 1107 (having the element substrate (1102) free of the electrolyte solution held thereon) of the rotary drum 1108 was returned to the starting position, the revolution of the rotary drum 1108 was suspended, and the electromagnet was removed from the element substrate.

Successively, the substrate carrying mechanism 1110 was lowered to reach the element substrate (1102) on the substrate holding segment 1107 of the rotary drum 1108 and to take up the element substrate (1102) from the rotary drum 1108. And the substrate carrying mechanism 1110 having the element substrate (1102) was horizontally moved to reach the other carriage belt 1115 and to unload the element substrate (1102) on the carriage belt. This carriage belt was operated to carry the element substrate (1102) outside the apparatus. Thus, there was obtained a photovoltaic element having a patterned transparent and electrically conductive film and which is free of short circuit defects. The time required for the etching and defect-eliminating treatment was 10 seconds.

The successive element substrates each held on the substrate holding segment 1107 of the rotary drum 1108 were continuously treated in the same manner as in the case of the above element substrate (1102).

By this, the 100 photovoltaic elements obtained in the above step 1 were continuously treated to obtain 100 patterned photovoltaic elements having a patterned transparent and electrically conductive film and which is free of short circuit defects.

3. Preparation of solar cell:

Using the 100 patterned photovoltaic elements free of short circuit defects obtained in the above step 2, solar cells were prepared in accordance with the procedures described in the step 3 (preparation of solar cell) in Example 1.

EVALUATION

The resultant 100 solar cells were evaluated in the same manner as in Example 1.

(1). For each solar cell, evaluation with respect to initial characteristics was conducted in the same manner as in Example 1.

As a result, the mean value among the shunt resistances obtained for the 100 solar cells was found to be 280 $\Omega \cdot cm^2$. All the solar cells were found to be free of shunts.

(2). For each solar cell, evaluation with respect to photoelectric conversion efficiency was conducted in the manner as in Example 1.

As a result, all the solar cells were found to have a satisfactory photoelectric conversion efficiency in the range of 7.2±0.2%.

Successively, for each solar cell, the portions patterned by the etching treatment were examined by means of a microscope. As a result, the 100 solar cells were found to be almost free of disconnection and defectively etched portion and to have a uniformly etched line. The yield was found to be 98%.

(3). Using some of the 100 solar cells and in accordance with a conventional process for producing a solar cell module by way of the conventional thermocompression lamination treatment, there were obtained a plurality of solar cell modules. For the resultant solar cell modules, reliability testing was conducted in the same manner as in Example 1. As a result, the mean value among the deterioration proportions obtained for all the solar cell modules was found to be about 2.0% which is satisfactory.

From the evaluated results above described, the following facts are understood. That is, the patterning and the elimination of short circuit defects can be surely conducted by the foregoing etching and defect-eliminating treatment, and all the solar cells produced by way of the by the foregoing etching and defect-eliminating treatment are good in initial characteristics and highly reliable. In addition, it is understood that the process according to the present invention enables mass-production of a highly reliable solar cell without the necessity of conducting any provisional step before and after the etching treatment by way of electrolysis, and at an improved treatment speed and with a short period of time required for the etching and defect-eliminating treatment.

EXAMPLE 6

In this example, there were prepared 100 p-i-n junction triple cell type amorphous solar cells having the constitution shown in FIGS. 3(a) and 3(b) while patterning their transparent and electrically conductive films and eliminating short circuit defects possibly created in the fabrication of said amorphous solar cell, using the apparatus shown in FIG. 10 capable of continuously conducting the etching process and the short circuit defects-eliminating process, in the following manner.

1. Preparation of photovoltaic element:

In accordance with the procedures for the preparation of a photovoltaic element, described in the step 1 (preparation of photovoltaic element) of Example 2, there were prepared 100 p-i-n junction triple cell type photovoltaic elements.

2. Etching treatment and short circuit defects-eliminating treatment:

For the 100 photovoltaic elements obtained in the above step 1, etching treatment (patterning treatment) and short circuit defects-eliminating treatment (these treatments will be hereinafter referred to as etching and defect-eliminating treatment) were continuously conducted in the same manner as in the step 2 of Example 5.

Particularly, the 100 photovoltaic elements obtained in the above step 1 were successively introduced into the apparatus shown in FIG. 10 and they were continuously subjected to the etching treatment and short circuit defects-eliminating treatment in the same manner as in the step 2 of Example 5, to thereby obtain 100 patterned photovoltaic elements having a patterned transparent and electrically conductive film and which is free of short circuit defects.

3. Preparation of solar cell:

Using the 100 patterned photovoltaic elements obtained in the above step 2, 100 solar cells were prepared in accordance with the procedures described in the step 3 (preparation of solar cell) in Example 1.

EVALUATION

The resultant 100 solar cells were evaluated in the same manner as in Example 1.

(1). For each solar cell, evaluation with respect to initial characteristics was conducted in the same manner as in Example 1.

As a result, the mean value among the shunt resistances obtained for the 100 solar cells was found to be 290 $k\Omega \cdot cm^2$. All the solar cells were found to be free of shunts.

(2). For each solar cell, evaluation with respect to photoelectric conversion efficiency was conducted in the manner as in Example 1.

As a result, all the solar cells were found to have a satisfactory photoelectric conversion efficiency in the range of 9.2±0.2%.

Successively, for each solar cell, the portions patterned by the etching treatment were examined by means of a microscope. As a result, the 100 solar cells were found to be almost free of disconnections and defectively etched portions and to have a uniformly etched line. The yield was found to be 98%.

(3). Using some of the 100 solar cells and in accordance with a conventional process for producing a solar cell module by way of the conventional thermocompression lamination treatment, there were obtained a plurality of solar cell modules. For the resultant solar cell modules, reliability testing was conducted in the same manner as in Example 1. As a result, the mean value among the deterioration proportions obtained for all the solar cell modules was found to be about 2.1% which is satisfactory.

From the evaluated results above-described, the following facts are understood. That is, the patterning precision by the foregoing etching treatment is good, and all the solar cells produced by way of the patterning by the foregoing etching treatment are good in initial characteristics and highly reliable. In addition, it is understood that the process according to the present invention enables mass-production of a highly reliable solar cell without the necessity of conducting any provisional step before and after the etching treatment by way of electrolysis and at an improved treatment speed and with a short period of time required for the etching treatment.

EXAMPLE 7

The procedures of Example 5 were repeated, except that instead of the direct current of 25 A applied in the etching treatment, a pulse current of 20 Å was applied five times between the counter electrode and the element substrate, to thereby obtain 100 amorphous solar cells.

EVALUATION

The resultant 100 solar cells were evaluated in the same evaluation manner as in Example 1.

(1). For each solar cell, evaluation with respect to initial characteristics was conducted in the same manner as in Example 1.

As a result, the mean value among the shunt resistances obtained for the 100 solar cells was found to be 300 Ω.cm². And all the solar cells were found to be free of a shunt created.

(2). For each solar cell, evaluation with respect to photoelectric conversion efficiency was conducted in the manner as in Example 1.

As a result, all the solar cells were found to have a satisfactory photoelectric conversion efficiency in the range of 7.1±0.2%.

Successively, for each solar cell, the portions patterned by the etching treatment were examined by means of a microscope. As a result, the 100 solar cells were almost found to be free of disconnections and defectively etched portions and to have a uniformly etched line. The yield was found to be 98%.

(3). Using some of the 100 solar cells and in accordance with a conventional process for producing a solar cell module by way of the conventional thermocompression lamination treatment, there were obtained a plurality of solar cell modules. For the resultant solar cell modules, reliability testing was conducted in the same manner as in Example 1. As a result, the mean value among the deterioration proportions obtained for all the solar cell modules was found to be about 2.1% which is satisfactory.

From the evaluated results above described, the following facts are understood. That is, the patterning precision by the foregoing etching treatment is good, and all the solar cells produced by way of the patterning by the foregoing etching treatment are good in initial characteristics and highly reliable. In addition, it is understood that the process according to the present invention enables mass-production of a highly reliable solar cell without the necessity of conducting any provisional steps before and after the etching treatment by way of electrolysis and at an improved treatment speed and with a short period of time required for the etching treatment.

EXAMPLE 8

The procedures of Example 5 were repeated, except that instead of the D.C. bias voltage of 4.5 V applied in the etching treatment, a voltage of 4.5 was intermittently applied five times at a interval of 1 second by way of pulse impression between the counter electrode and the element substrate, to thereby obtain 100 amorphous solar cells.

EVALUATION

The resultant 100 solar cells were evaluated in the same evaluation manner as in Example 1.

(1). For each solar cell, evaluation with respect to initial characteristics was conducted in the same manner as in Example 1.

As a result, the mean value among the shunt resistances obtained for the 100 solar cells was found to be 410 kΩ.cm². All the solar cells were found to be free of shunts.

(2). For each solar cell, evaluation with respect to photoelectric conversion efficiency was conducted in the manner as in Example 1.

As a result, all the solar cells were found to have a satisfactory photoelectric conversion efficiency in the range of 7.2±0.1%.

Successively, for each solar cell, the portions patterned by the etching treatment were examined by means of a microscope. As a result, the 100 solar cells were almost found to be free of disconnections and defectively etched portions and to have a uniformly etched line. The yield was found to be 98%.

(3). Using some of the 100 solar cells and in accordance with a conventional process for producing a solar cell module by way of the conventional thermocompression lamination treatment, there were obtained a plurality of solar cell modules. For the resultant solar cell modules, reliability testing was conducted in the same manner as in Example 1. As a result, the mean value among the deterioration proportions obtained for all the solar cell modules was found to be about 2.0% which is satisfactory.

From the results above-described, the following facts are understood. That is, the patterning precision by the foregoing etching treatment is good, and all the solar cells produced by way of the patterning by the foregoing etching treatment are good in initial characteristics and highly reliable. In addition, it is understood that the process according to the present invention enables mass-production of a highly reliable solar cell without the necessity of conducting any provisional step before and after the etching treatment by way of electrolysis and at an improved treatment speed and with a short period of time required for the etching treatment.

What is claimed is:

1. A method for etching a substrate having a portion to be etched, comprising the steps of:

(a) immersing said substrate in an electrolyte solution such that said substrate serves as a negative electrode, (b) arranging a counter electrode having a pattern corresponding to a desired etching pattern to be formed at said portion to be etched of said substrate in said electrolyte solution so as to maintain an interval between said counter electrode and said substrate, and (c) applying a direct current or a pulse current between said substrate and said counter electrode to etch said portion to be etched of said substrate into a pattern corresponding to said pattern of said counter electrode.

2. The method according to claim 1, wherein the substrate is positioned in close proximity to the counter electrode.

3. The method according to claim 1, wherein the interval between the substrate and the counter electrode is in the range of from 0.1 mm to 2 mm.

4. The method according to claim 1, wherein the portion to be etched of the substrate comprises a film formed on the substrate.

5. The method according to claim 4, wherein the film is a transparent and electrically conductive film.

6. The method according to claim 4, wherein the film comprises at least a material formed by means of vacuum evaporation, ionization evaporation, sputtering, CVD, plasma CVD, or spraying.

7. The method according to claim 1, wherein the portion to be etched of the substrate comprises a film formed on the substrate through a semiconductor layer.

8. The method according to claim 7, wherein the film is a transparent and electrically conductive film.

9. The method according to claim 1, wherein the portion to be etched of the substrate comprises a transparent and electrically conductive film.

10. The method according to claim 1, wherein a gapping member is positioned between the substrate and the counter electrode.

11. The method according to claim 10, wherein the gapping member comprises a soft material.

12. The method according claim 10, wherein the gapping member comprises a silicone rubber or a silicone sponge.

13. The method according claim 1, wherein the portion to be etched of the substrate comprises at least a material selected from the group consisting of $SnO_2$, $In_2O_3$, and ITO (indiumtin oxide).

14. The method according to claim 1, wherein the electrolyte solution contains at least a compound selected from the group consisting of sodium chloride, potassium chloride, aluminum chloride, zinc chloride, tin chloride, ferric chloride, sodium nitride, potassium nitride, hydrochloric acid, nitric acid, and sulfuric acid as an electrolyte.

15. The method according to claim 1, wherein the counter electrode comprises at least a material selected from the group consisting of platinum, carbon, gold, stainless steel, nickel, copper and lead.

16. The method according to claim 1, wherein etching the portion to be etched of the substrate is conducted while contacting a non-etching portion of the portion to be etched with a gapping member arranged on the counter electrode side.

17. A process for producing a semiconductor device, comprising the steps of:
   (a) a step of immersing a substrate for a semiconductor device and having a portion comprising a film to be etched in an electrolyte solution such that said substrate serves as a negative electrode,
   (b) a step of arranging a counter electrode having a pattern corresponding to a desired etching pattern to be formed at said portion to be etched of said substrate in said electrolyte solution so as to maintain an interval between said counter electrode and said substrate, and
   (c) an etching step of applying a direct current or a pulse current between said substrate and said counter electrode to etch said portion to be etched of said substrate into a pattern corresponding to said pattern of said counter electrode.

18. The process according to claim 17, wherein the substrate is positioned in close proximity to the counter electrode.

19. The process according to claim 17, wherein the interval between the substrate and the counter electrode is in the range of from 0.1 mm to 2 mm.

20. The process according to claim 17, wherein the portion to be etched comprises a film formed on the substrate.

21. The process according to claim 20, wherein the film is a transparent and electrically conductive film.

22. The process according to claim 20, wherein the film comprises at least a material formed by means of vacuum evaporation, ionization evaporation, sputtering, CVD, plasma CVD, or spraying.

23. The process according to claim 17, wherein the portion to be etched comprises a film formed on the substrate through a semiconductor layer.

24. The process according to claim 23, wherein the film is a transparent and electrically conductive film.

25. The process according to claim 23, wherein the semiconductor layer has at least a combination of an n-type layer, an i-type layer and a p-type layer.

26. The process according to claim 23, wherein the semiconductor layer contains a material selected from the group consisting of an amorphous material, polycrystalline material, microcrystalline material and single-crystalline material.

27. The process according to claim 17, wherein the portion to be etched comprises a transparent and electrically conductive film.

28. The process according to claim 17, wherein a gapping member is positioned between the substrate and the counter electrode.

29. The process according to claim 28, wherein the gapping member comprises a soft material.

30. The process according claim 28, wherein the gapping member comprises a silicone rubber or a silicone sponge.

31. The process according claim 17, wherein the portion to be etched comprises at least a material selected from the group consisting of $SnO_2$, $In_2O_3$, and ITO (indiumtin oxide).

32. The process according to claim 17, wherein the electrolyte solution contains at least a compound selected from the group consisting of sodium chloride, potassium chloride, aluminum chloride, zinc chloride, tin chloride, ferric chloride, sodium nitride, potassium nitride, hydrochloric acid, nitric acid, and sulfuric acid as an electrolyte.

33. The process according to claim 17, wherein the counter electrode comprises at least a material selected from the group consisting of platinum, carbon, gold, stainless steel, nickel, copper and lead.

34. The process according to claim 17, wherein etching the portion to be etched is conducted while contacting a non-etching portion of the portion to be etched with a gapping member arranged on the counter electrode side.

35. The process according to claim 17 which further comprises conducting a defect elimination step after the etching step (c), said defect elimination step comprising subjecting the etched product obtained in the etching step (c) to electrolytic reduction by applying a direct current or a pulse current to cause a forward bias on the substrate side whereby removing at least a non-etched film present around a defective portion of the etched portion of the etched product.

36. The process according to claim 35, wherein the etching step (c) and the defect elimination step are conducted in the same electrolyte solution.

37. The process according to claim 35, wherein the distance between the portion to be etched and the counter electrode in the defect elimination step is made to be greater than that between the portion to be etched and the counter electrode in the etching step (c).

38. The process according to claim 35, wherein the defect elimination step is conducted using an electrolyte solution containing at least a compound selected from the group consisting of sodium chloride, potassium chloride, aluminum chloride, zinc chloride, tin chloride, ferric chloride, sodium nitride, potassium nitride, hydrochloric acid, nitric acid, and sulfuric acid as an electrolyte.

39. The process according to claim 17, wherein the semiconductor device is a photosemiconductor device.

40. The process according to claim 17, wherein the semiconductor device is a photovoltaic element.

* * * * *

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

Page 1 of 8

It is certified that error appears in the above-identified patent and that said Letters Patent is hereby corrected as shown below:

COLUMN 1

Line 12, "to" (1st occurrence) should be deleted;
Line 17, "semi-" should read --said semi- --; and
Line 18, "etching," should read --etching--.

COLUMN 2

Line 11, "whereby" should read --thereby--;
Line 25, "manner of" should be deleted and
"plasma" should read --means of plasma--; and
Line 67, "(Indium Tin Oxide.)" should read
--(Indium Tin Oxide)--.

COLUMN 3

Line 1, "whereby" should read --thereby--;
Line 54, "effect to" should read --effect--;
Line 57, "shunts the" should read --shunts in the--; and
Line 66, "by way" should be deleted.

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

It is certified that error appears in the above-identified patent and that said Letters Patent is hereby corrected as shown below:

COLUMN 4

Line 23, "in" should be deleted; and
    Line 59, "that" should read --in which--.

COLUMN 5

Line 17, "stepsO" should read --steps,--.

COLUMN 7

Line 8, "can-be" should read --can be--.

COLUMN 8

Line 44, "whereby" should read --thereby--; and
    Line 61, "(chemical." should read --(chemical--.

COLUMN 9

Line 1, "When" should read --when--;
    Line 4, "reaction a" should read --reaction at a--;
    Line 36, "employed," should read --be employed,--; and
    Line 38, "substrate" should read --the substrate--.

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

It is certified that error appears in the above-identified patent and that said Letters Patent is hereby corrected as shown below:

COLUMN 11

```
Line 16, "of the" should be deleted;
Line 28, "a electric" should read --an electric--;
Line 40, "pn" should read --p-n--; and
         "pin" should read --p-i-n--;
Line 46, "pn" should read --p-n--; and
         "pin" should read --p-i-n--; and
Line 51, "pn" should read --p-n--; and
         "pin" should read --p-i-n--.
```

COLUMN 12

```
Line 1, "when" should be deleted;
Line 9, "chracter-" should read --character- --;
Line 12, "the use in outdoors" should read
         --outdoor use--;
Line 17, "present" should read --present invention--; and
Line 18, "invention" should be deleted.
```

COLUMN 13

```
Line 8, "in to" should read --into--.
```

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

It is certified that error appears in the above-identified patent and that said Letters Patent is hereby corrected as shown below:

COLUMN 14

Line 39, "502" should read --502 attached thereto--.

COLUMN 15

Line 18, "whereby" should read --thereby--.

COLUMN 17

Line 2, "The" should read --the--; and
    Line 30, "to eliminate" should read --eliminating--.

COLUMN 19

Line 15, "arrive" should read --bring--.

COLUMN 21

Line 29, "above described," should read
        --above-described,--; and
    Line 58, "the accor-" should read --accor- --.

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

It is certified that error appears in the above-identified patent and that said Letters Patent is hereby corrected as shown below:

COLUMN 22

```
Line 46, "a inferior" should read --an inferior--; and
Line 59, "Junction" should read --junction--.
```

COLUMN 24

```
Line 15, "is, good" should read --is good,--.
```

COLUMN 25

```
Line 11, "3." should be deleted; and
Line 45, "evaluation" should be deleted.
```

COLUMN 26

```
Line 40, "patterned" should read --Patterned--;
Line 41, "have" should read --having--;
Line 47, "to free" should read --to be free--; and
Line 48, "its" should read --and its--.
```

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

It is certified that error appears in the above-identified patent and that said Letters Patent is hereby corrected as shown below:

COLUMN 27

```
Line 50, "the the" should read --the--; and
Line 56, "stand by" should read --stand-by--.
```

COLUMN 29

```
Line 28, "above described," should read
         --above-described,--; and
Line 32, "by way of the" should be deleted.
```

COLUMN 30

```
Line 31, "result ," should read --result,--
```

UNITED STATES PATENT AND TRADEMARK OFFICE
CERTIFICATE OF CORRECTION

PATENT NO.  : 5,863,412

DATED       : January 26, 1999

INVENTOR(S) : HIROFUMI ICHINOSE, ET AL.

It is certified that error appears in the above-identified patent and that said Letters Patent is hereby corrected as shown below:

COLUMN 31

Line 6, "And all" should read --All--;
    Line 7, "created" should be deleted;
    Line 16, "almost" should be deleted;
    Line 17, "be" should read --be almost--;
    Line 30, "above described" should read
        --above-described--; and
    Line 47, "a interval" should read --an interval--.

COLUMN 32

Line 4, "almost" should be deleted; and
    Line 5, "be" should read --be almost--.

COLUMN 33

Line 3, "claim" should read --to claim--;
    Line 5, "claim" should read --to claim--; and
    Line 8, "(indiumtin oxide)." should read
        --(Indium Tin Oxide).--.

UNITED STATES PATENT AND TRADEMARK OFFICE
CERTIFICATE OF CORRECTION

PATENT NO. : 5,863,412

DATED : January 26, 1999

INVENTOR(S): HIROFUMI ICHINOSE, ET AL.

It is certified that error appears in the above-identified patent and that said Letters Patent is hereby corrected as shown below:

<u>COLUMN 34</u>

Line 14, "claim" should read --to claim--;
Line 16, "claim" should read --to claim--;
Line 18, "(indiumtin oxide)." should read
    --(Indium Tin Oxide).--;
Line 38, "side" should read --side,--; and
Line 39, "whereby" should read --thereby--.

Signed and Sealed this

Thirtieth Day of November, 1999

Attest:

Q. TODD DICKINSON

Attesting Officer

Acting Commissioner of Patents and Trademarks